US012650675B2

(12) United States Patent
Mortemousque et al.

(10) Patent No.: US 12,650,675 B2
(45) Date of Patent: Jun. 9, 2026

(54) QUANTUM DEVICE, METHOD FOR READING THE STATE OF CHARGE, METHOD FOR DETERMINING A STABILITY DIAGRAM AND METHOD FOR DETERMINING SPIN CORRELATIONS

(71) Applicants:COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Pierre-André Mortemousque, Grenoble Cedex (FR); Benoit Bertrand, Grenoble Cedex (FR); Baptiste Jadot, Grenoble Cedex (FR); Tristan Meunier, Grenoble (FR); Matias Urdampilleta, Grenoble (FR); Maud Vinet, Grenoble Cedex (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 834 days.

(21) Appl. No.: 17/899,095

(22) Filed: Aug. 30, 2022

(65) Prior Publication Data

US 2023/0086994 A1    Mar. 23, 2023

(51) Int. Cl.
G05B 19/4099        (2006.01)
G06N 10/40          (2022.01)
(Continued)

(52) U.S. Cl.
CPC ......... G05B 19/4099 (2013.01); G06N 10/40 (2022.01); H10N 60/01 (2023.02);
(Continued)

(58) Field of Classification Search
CPC ...... G06N 10/40; G06N 10/00; H10N 60/128; H10N 69/00; H10N 60/01; H10N 60/11;
(Continued)

(56) References Cited

U.S. PATENT DOCUMENTS

| | | | | |
|---|---|---|---|---|
| 9,842,921 B2 * | 12/2017 | Eriksson | .............. | H10D 62/814 |
| 10,607,993 B2 * | 3/2020 | Hutin | .................. | H01L 23/5226 |

(Continued)

FOREIGN PATENT DOCUMENTS

| | | |
|---|---|---|
| CN | 103105724 A | 5/2013 |
| EP | 2 075 745 A1 | 7/2009 |

OTHER PUBLICATIONS

Search Report as issued in French Patent Application No. 2109107, dated May 5, 2022.

(Continued)

*Primary Examiner* — Didarul A Mazumder
(74) *Attorney, Agent, or Firm* — CUSHMAN PARTNERS, LLC

(57)        ABSTRACT
A semiconductor device includes a layer of a semiconductor material in which is formed an active zone; a plurality of first gates forming a plurality of lines substantially parallel to each other and covering in part the active zone; a plurality of second gates forming a plurality of columns; at least one third gate, designated measurement gate, extending along an axis substantially parallel to the lines of the plurality of lines and in a direction opposite to the lines of the plurality of lines with respect to the active zone, and a first electrode and a second electrode situated on either side of the plurality of measurement gates in the active zone.

18 Claims, 22 Drawing Sheets

(51) Int. Cl.

| | |
|---|---|
| *H10N 60/01* | (2023.01) |
| *H10N 60/10* | (2023.01) |
| *H10N 69/00* | (2026.01) |

(52) U.S. Cl.

CPC .......... *H10N 60/11* (2023.02); *H10N 60/128* (2023.02); *H10N 69/00* (2023.02); *G05B 2219/45031* (2013.01)

(58) Field of Classification Search

CPC .......... G05B 19/4099; H10D 48/3835; H10D 30/43; H10D 62/812; H10D 64/27; H10D 84/83; H10D 30/473; H10D 48/385; H10D 84/00; H10D 62/126; H10D 62/115; B82Y 10/00

USPC .......................................................... 257/14

See application file for complete search history.

(56) References Cited

U.S. PATENT DOCUMENTS

| | | | | |
|---|---|---|---|---|
| 10,978,578 | B2 * | 4/2021 | Petta | H10D 64/27 |
| 11,922,274 | B1 * | 3/2024 | George | H10D 48/3835 |
| 2015/0279981 | A1 * | 10/2015 | Eriksson | H10D 64/205 |
| | | | | 257/14 |
| 2020/0227522 | A1 * | 7/2020 | Leipold | H10D 30/43 |

OTHER PUBLICATIONS

Lee, N., et al., "Enhancing electrostatic coupling in silicon quantum dot array by dual gate oxide thickness for large scale integration," Applied Physics Letters, vol. 116, No. 16, Apr. 2020, XP012246323, 4 pages.

Fujita, T., et al., "Coherent shuttle of electron-spin states," Nature Partner Journals, Quantum Information, May 2017, pp. 1-6.

* cited by examiner

[Fig. 1]
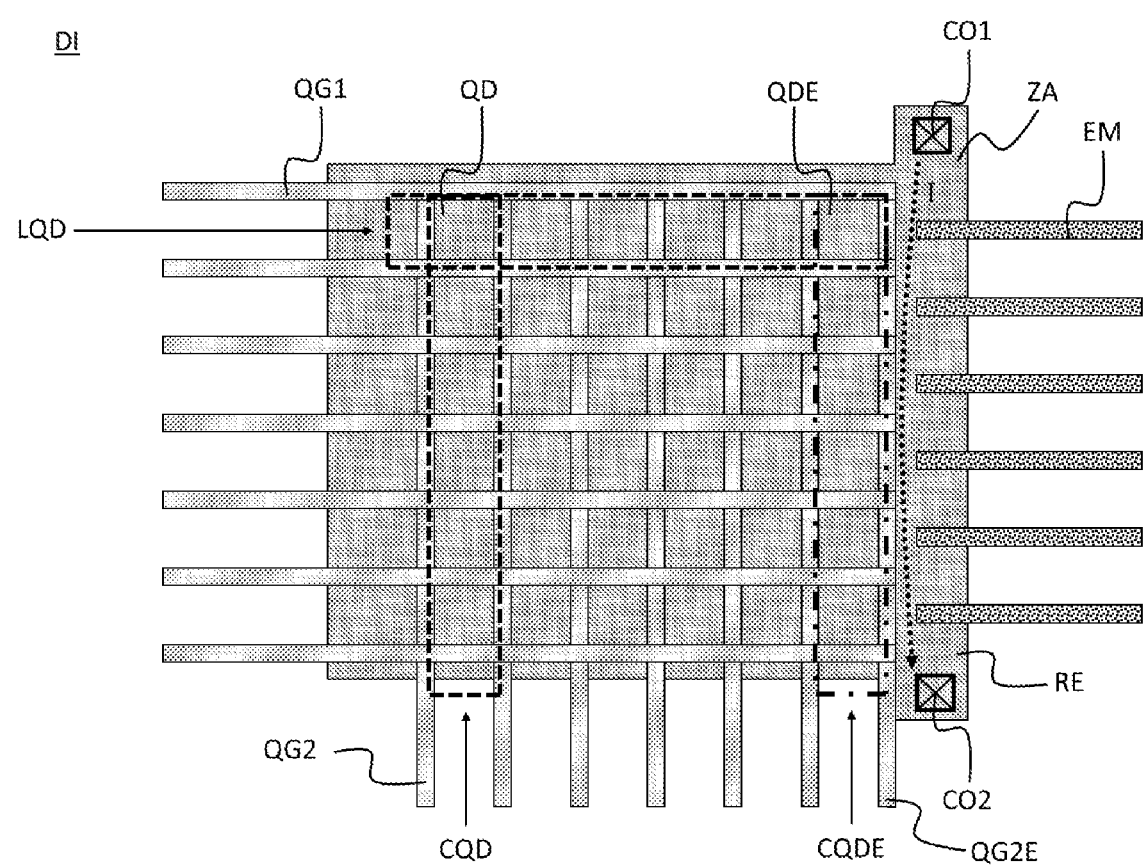

[Fig. 2]
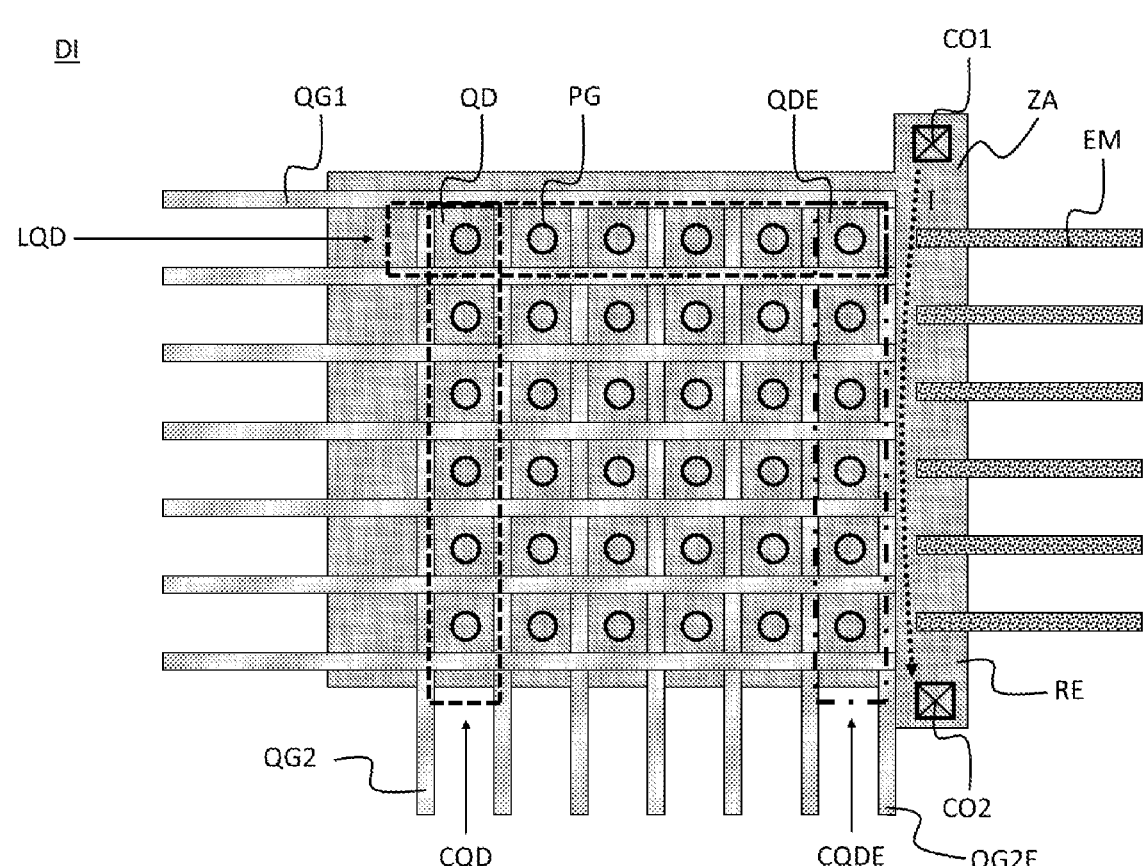

[Fig. 3]

[Fig. 4]
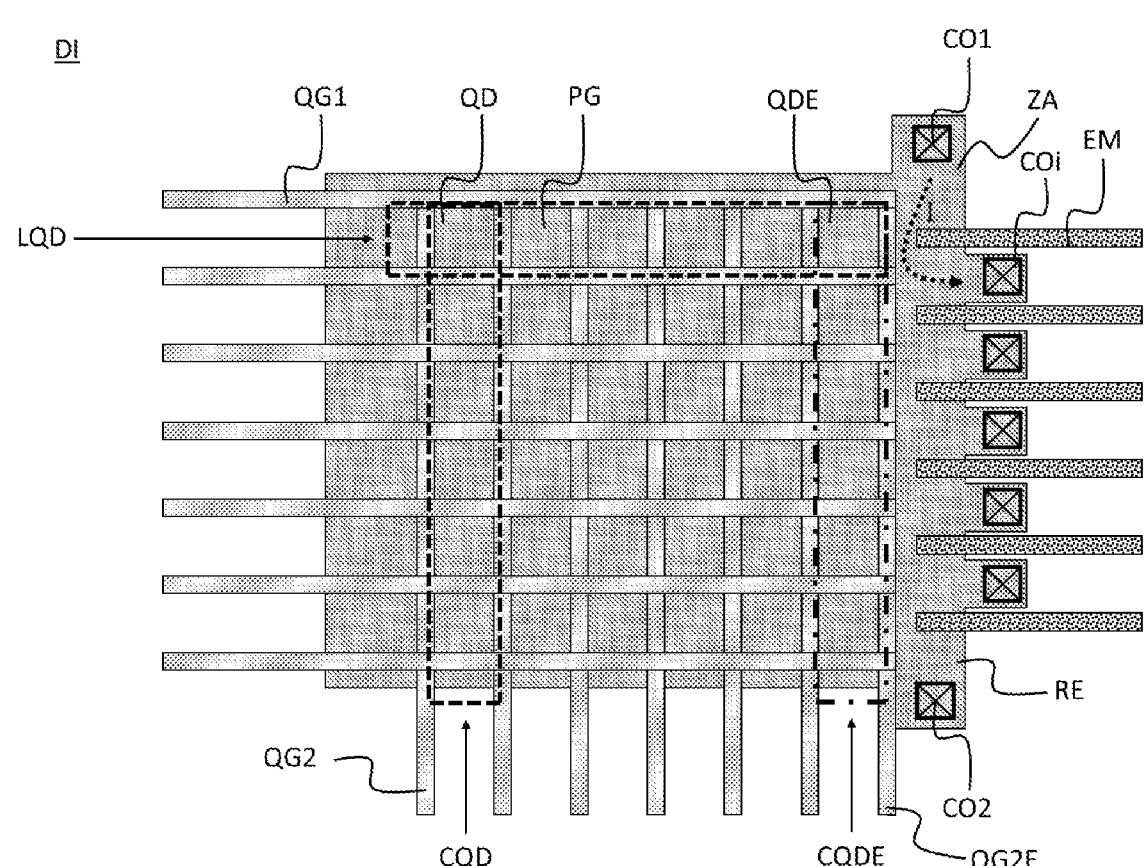

[Fig. 5]
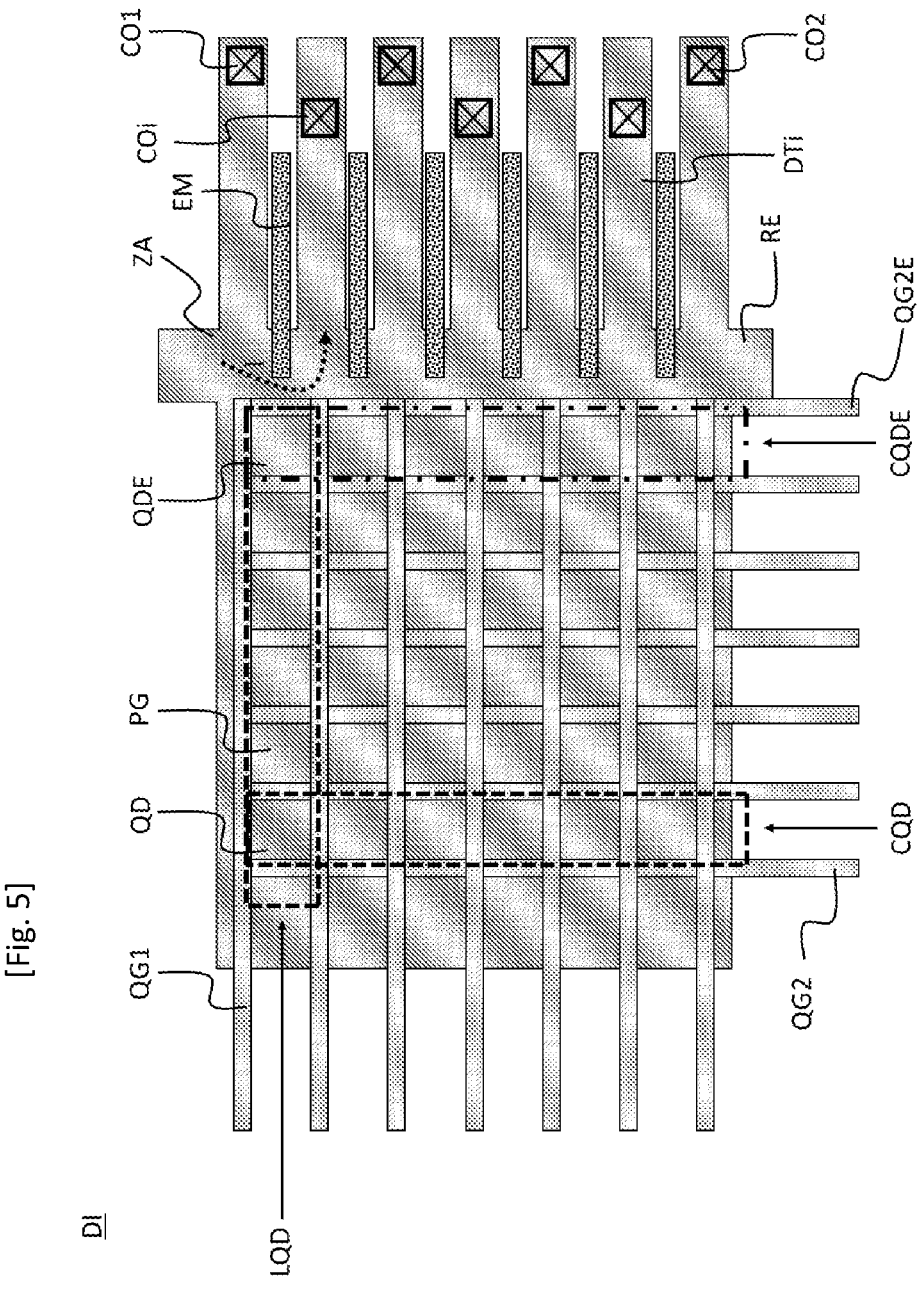

[Fig. 6]
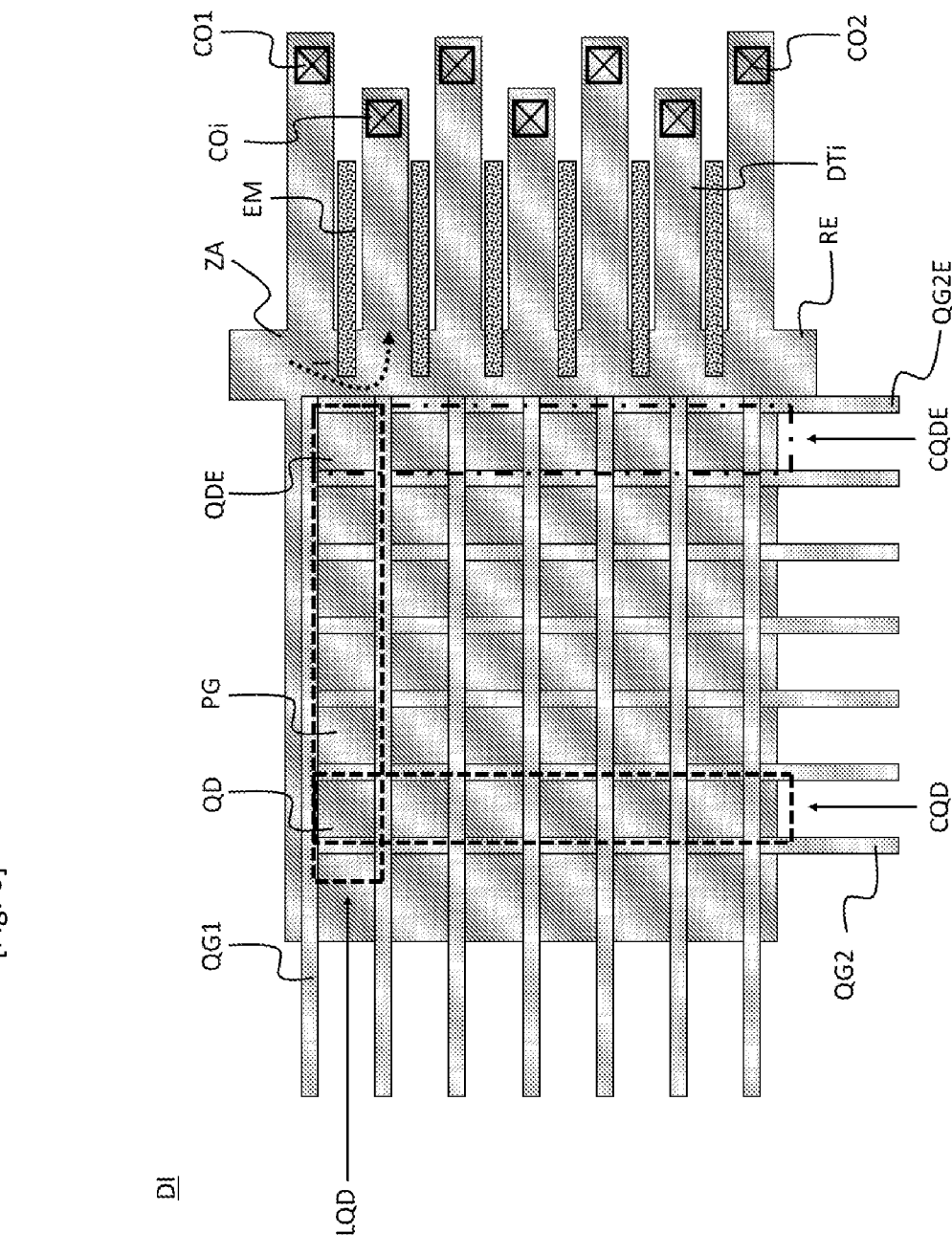

[Fig. 7A]
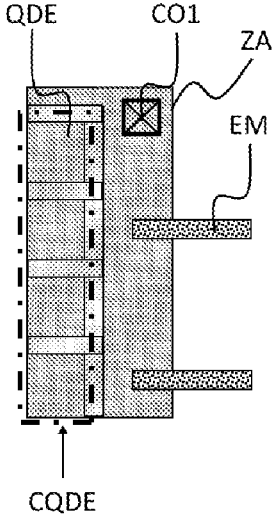
[Fig. 7B]
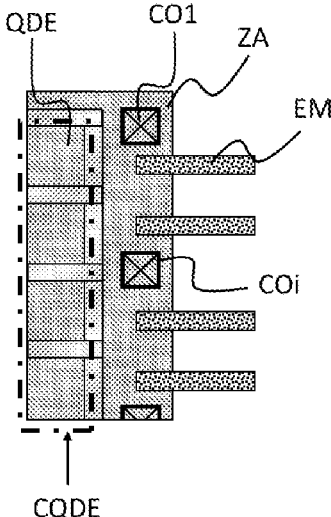
[Fig. 8]
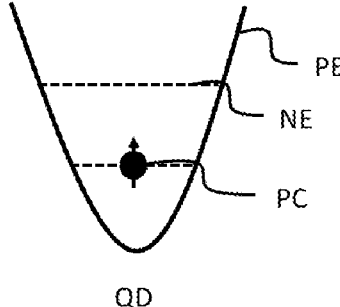

[Fig. 9]
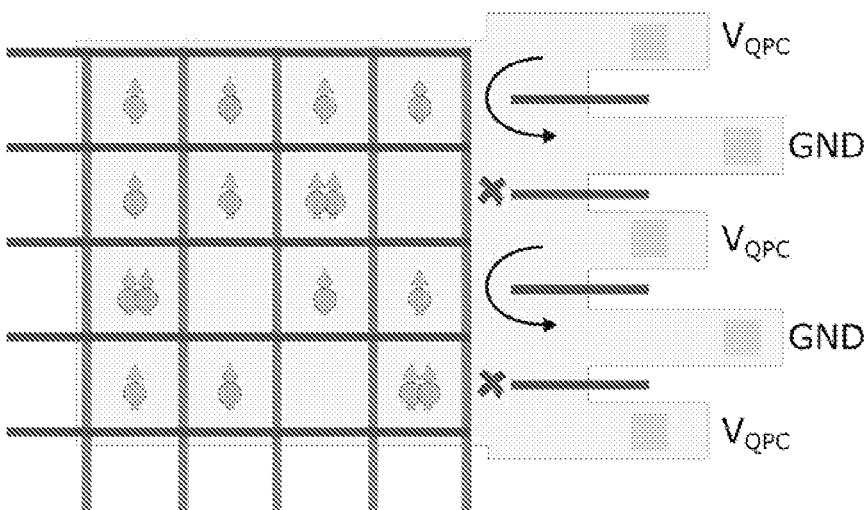
[Fig. 10]
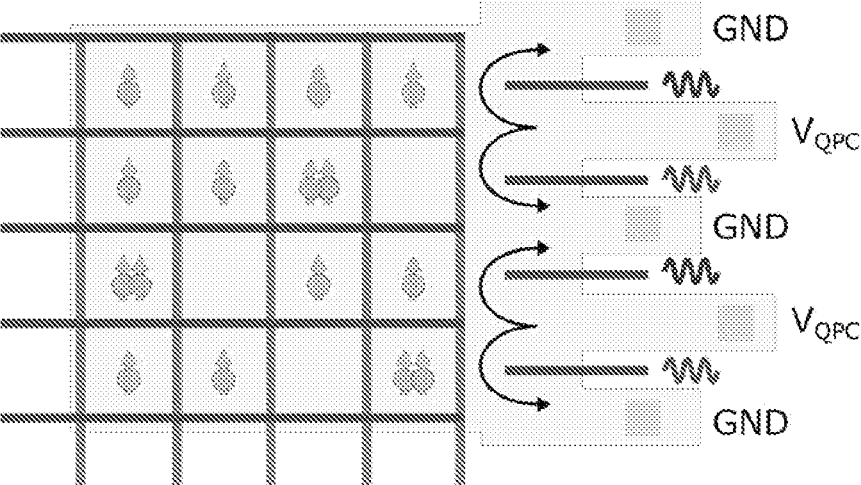

[Fig. 11]
<u>100</u>
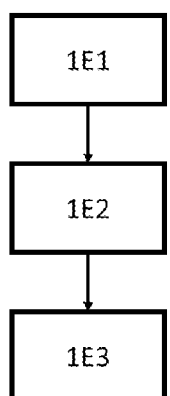

[Fig. 12]
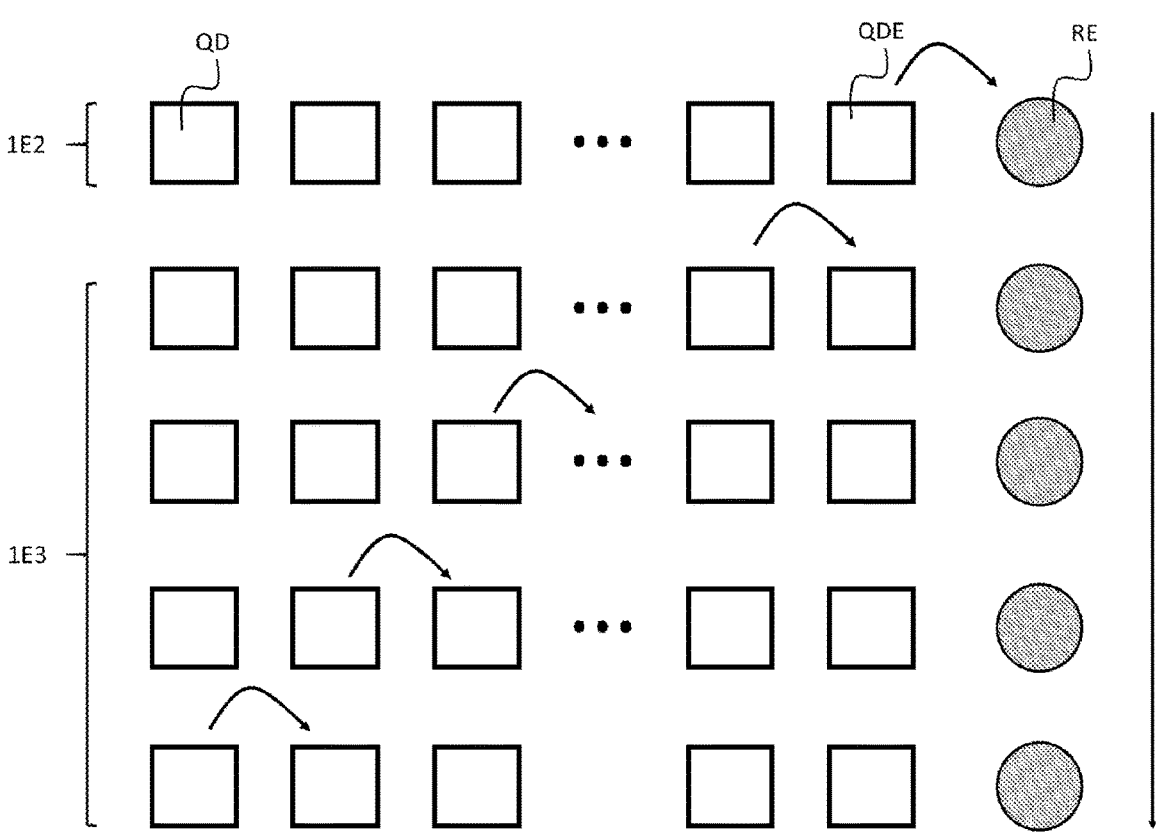
[Fig. 13]
200
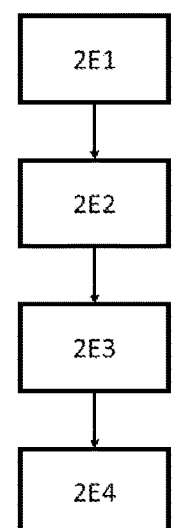

[Fig. 14]
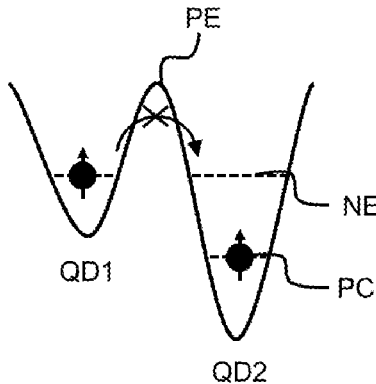
[Fig. 15]
300
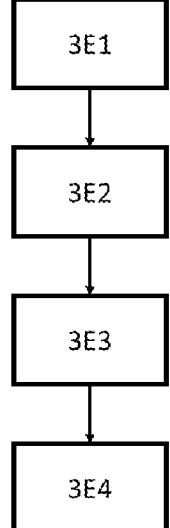

[Fig. 16A]
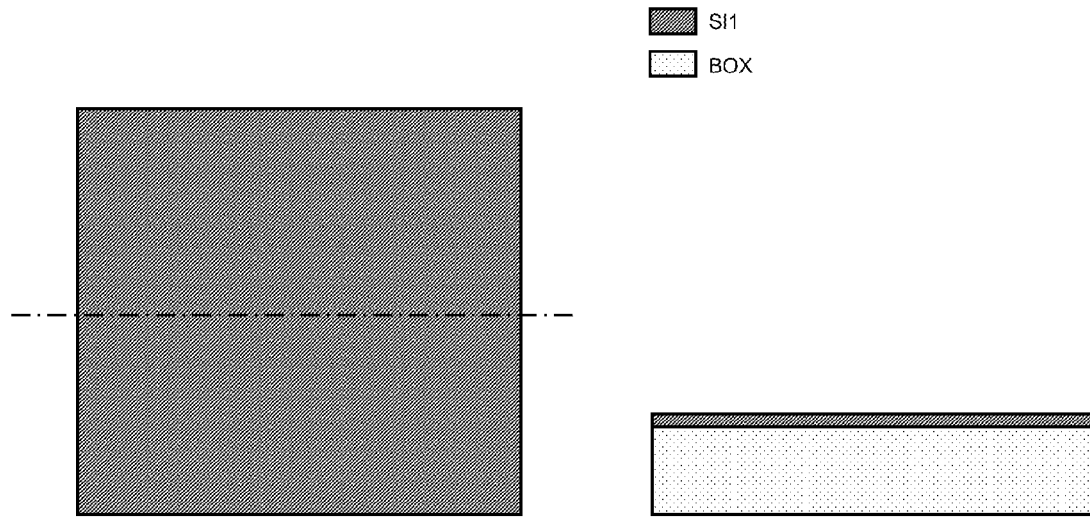
[Fig. 16B]
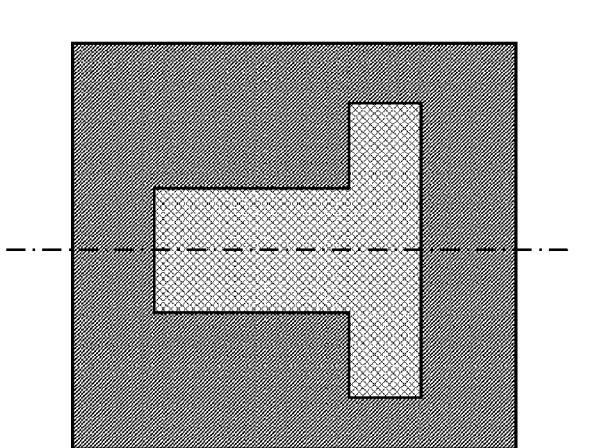
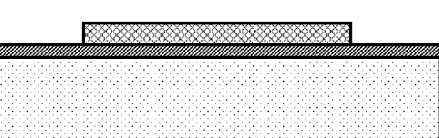

[Fig. 16C]
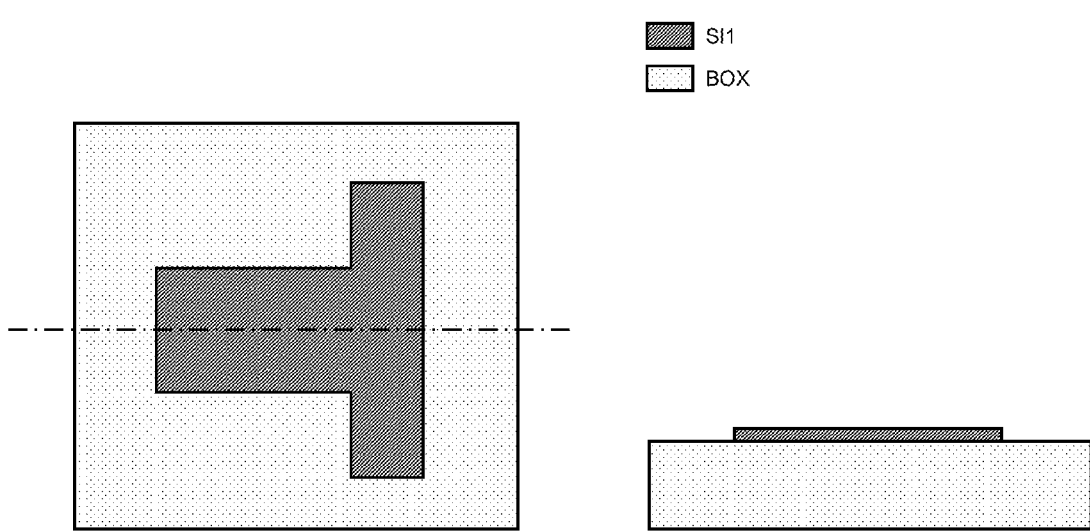
[Fig. 16D]
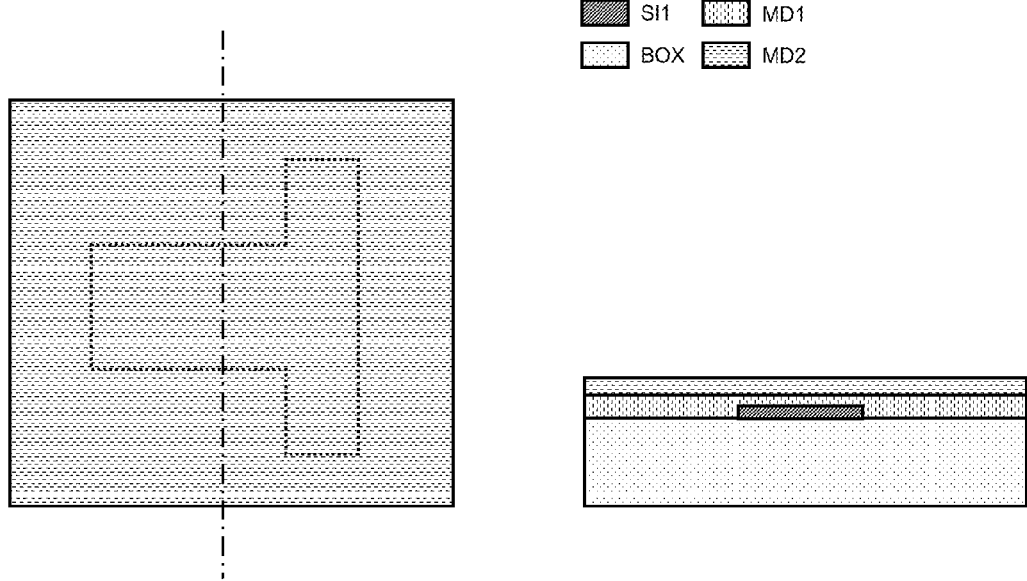

[Fig. 16E]
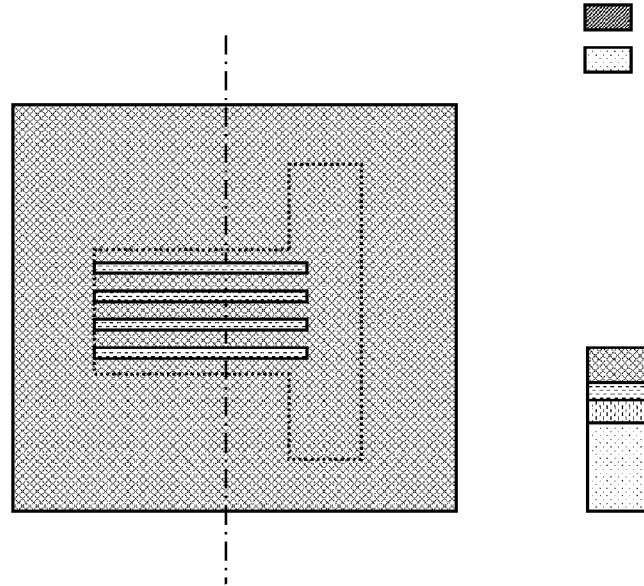
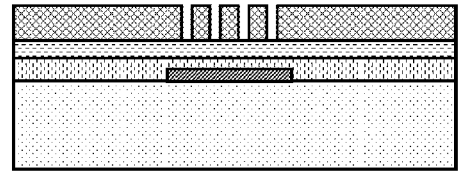
[Fig. 16F]
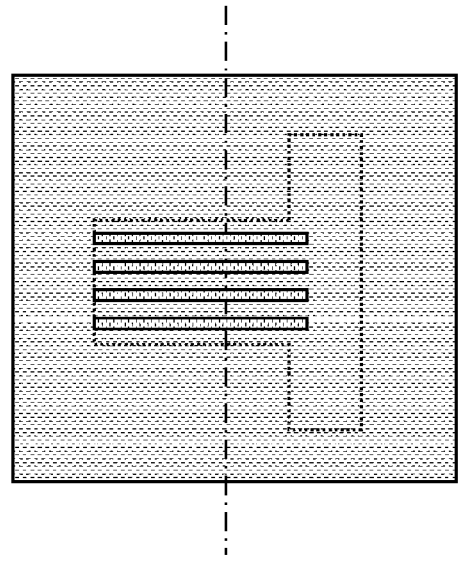
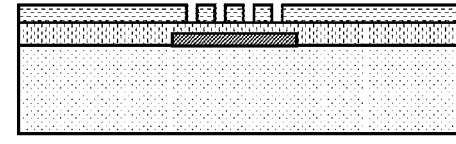

[Fig. 16G]
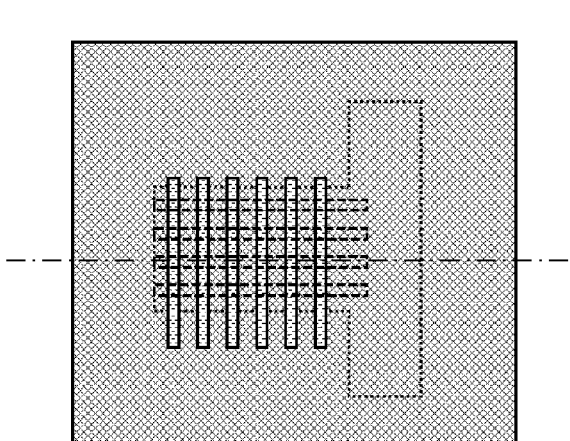
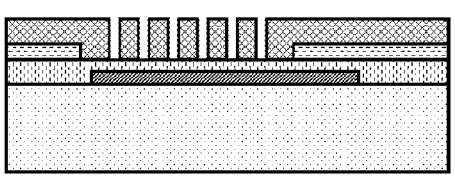
[Fig. 16H]
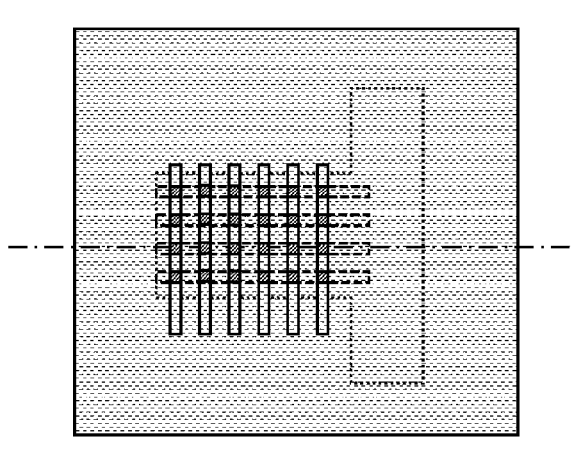
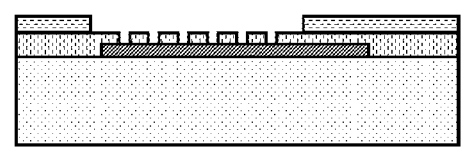

[Fig. 16I]
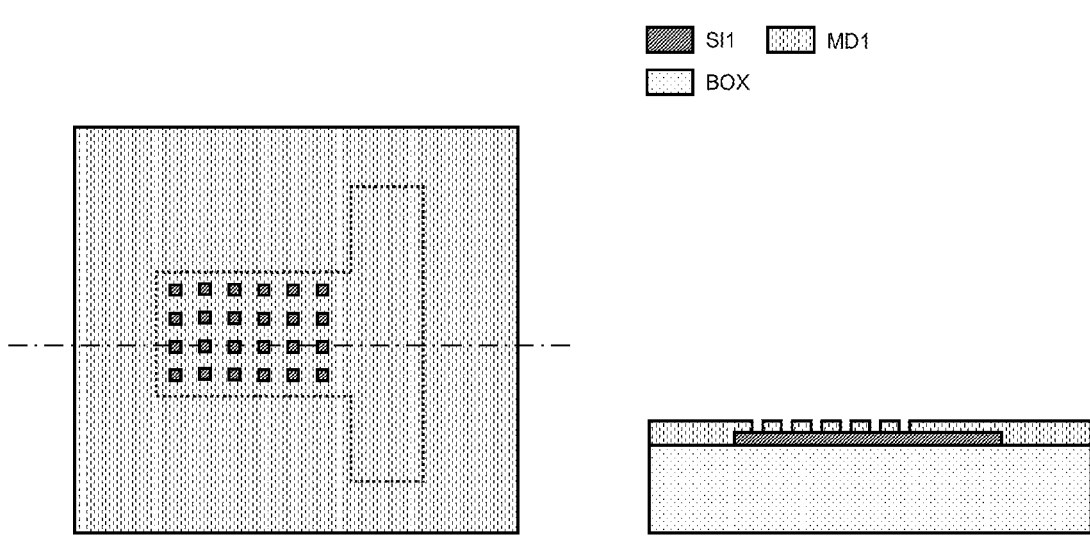
[Fig. 16J]
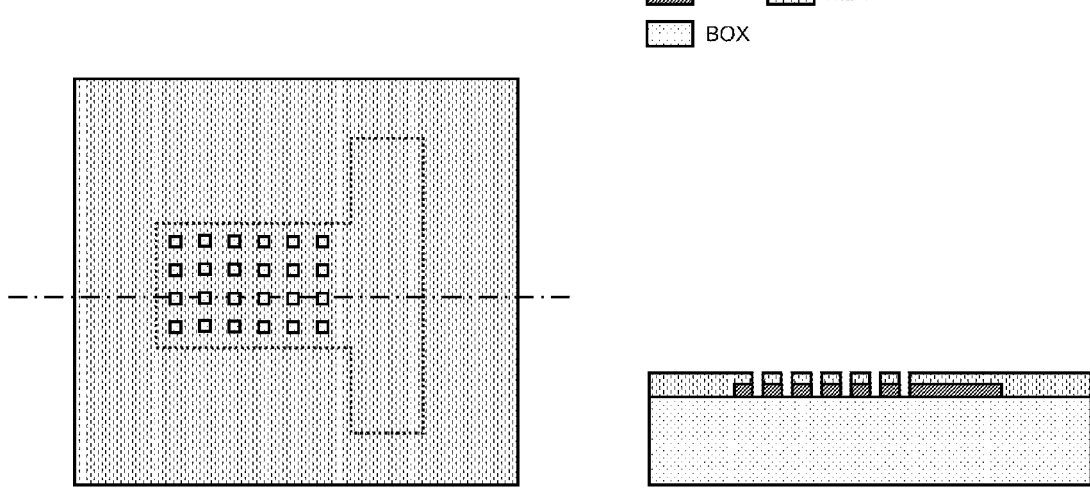

[Fig. 16K]
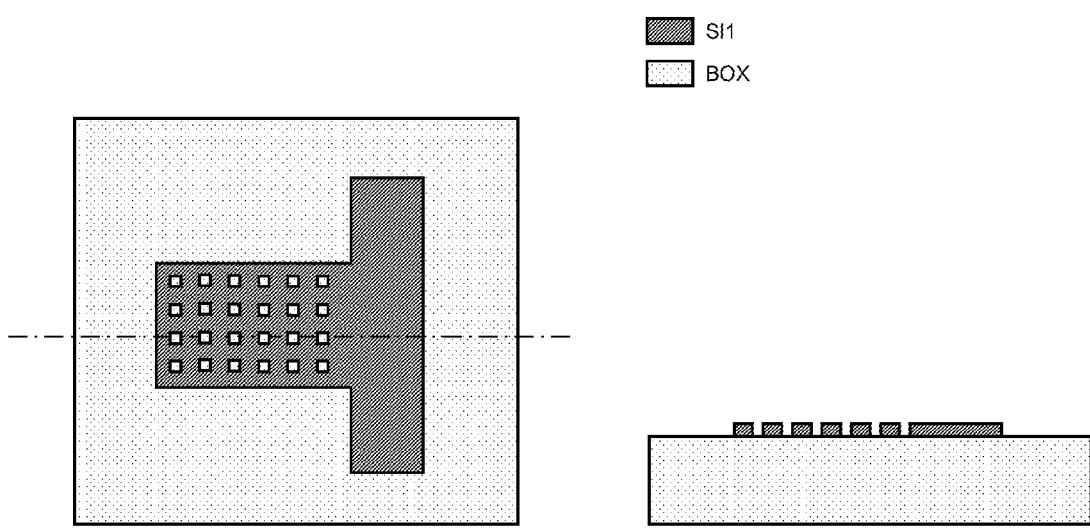
[Fig. 16L]
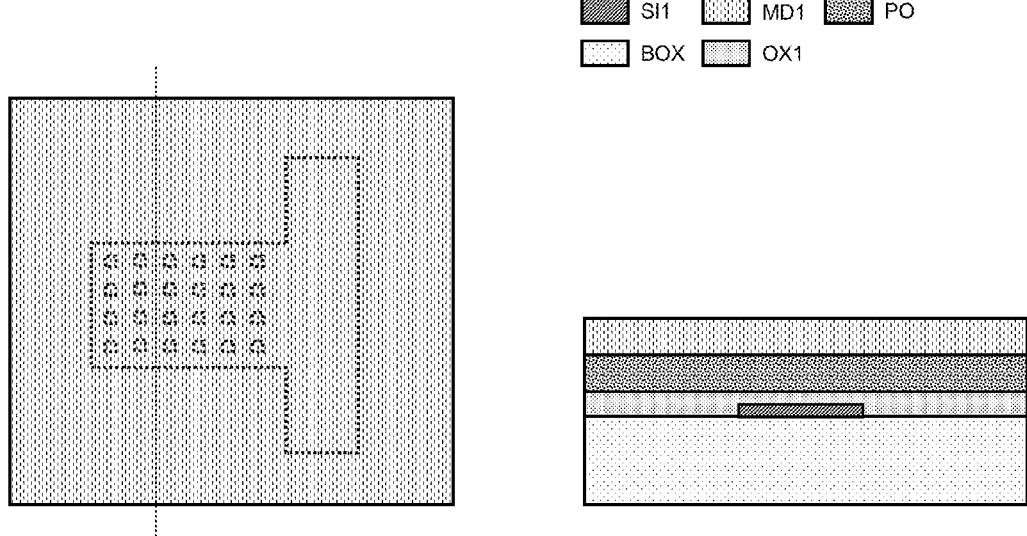

[Fig. 16M]
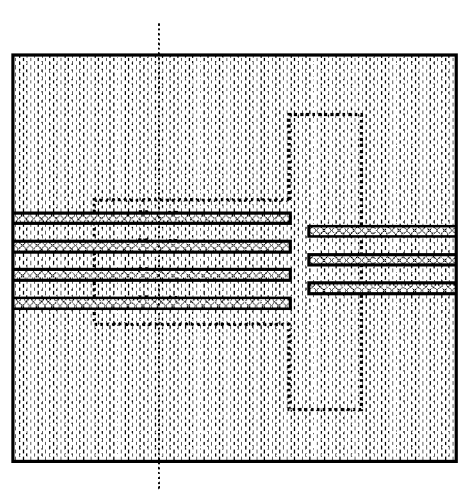
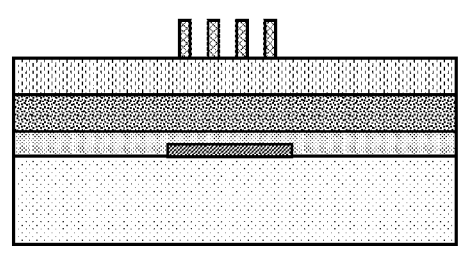
[Fig. 16N]
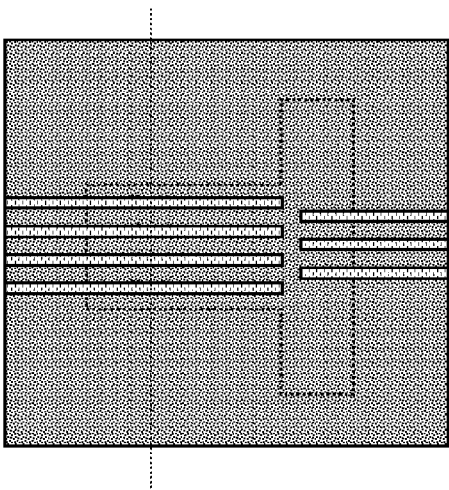
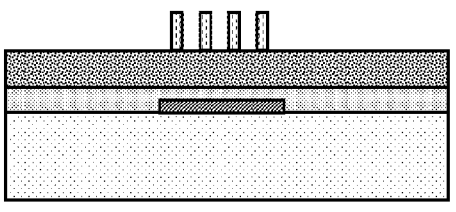

[Fig. 16O]
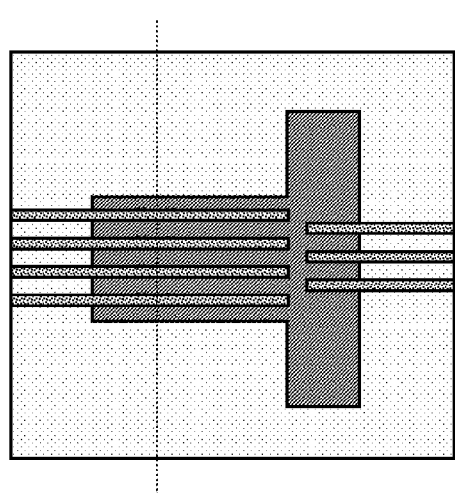
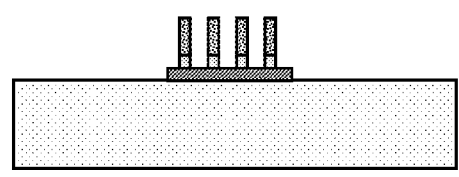
[Fig. 16P]
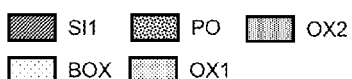
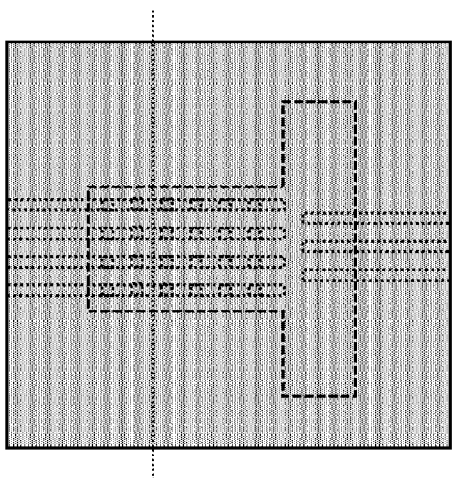
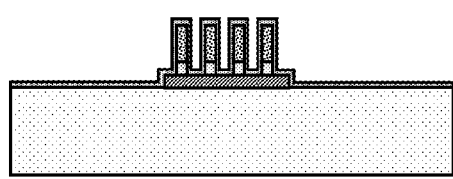

[Fig. 16Q]
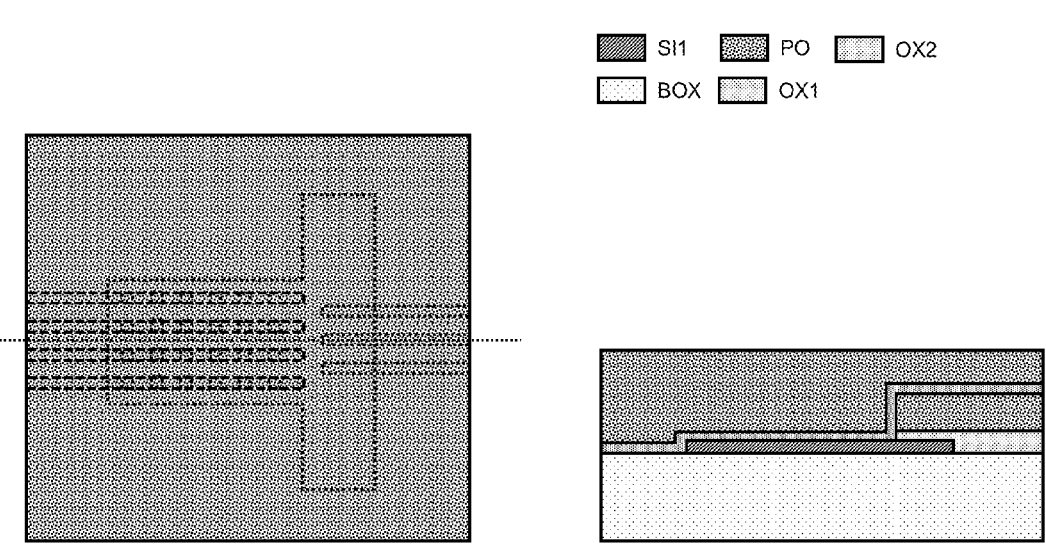
[Fig. 16R]
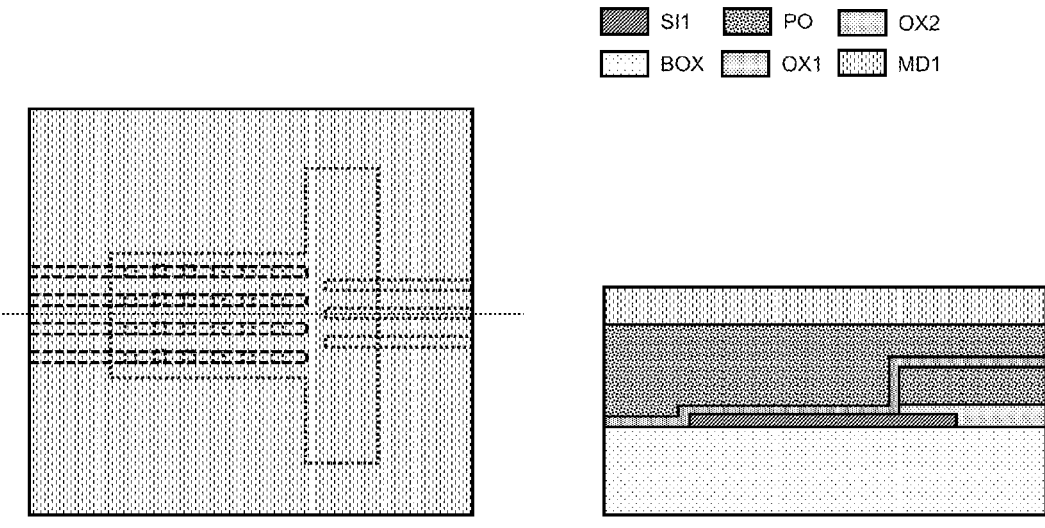

[Fig. 16S]
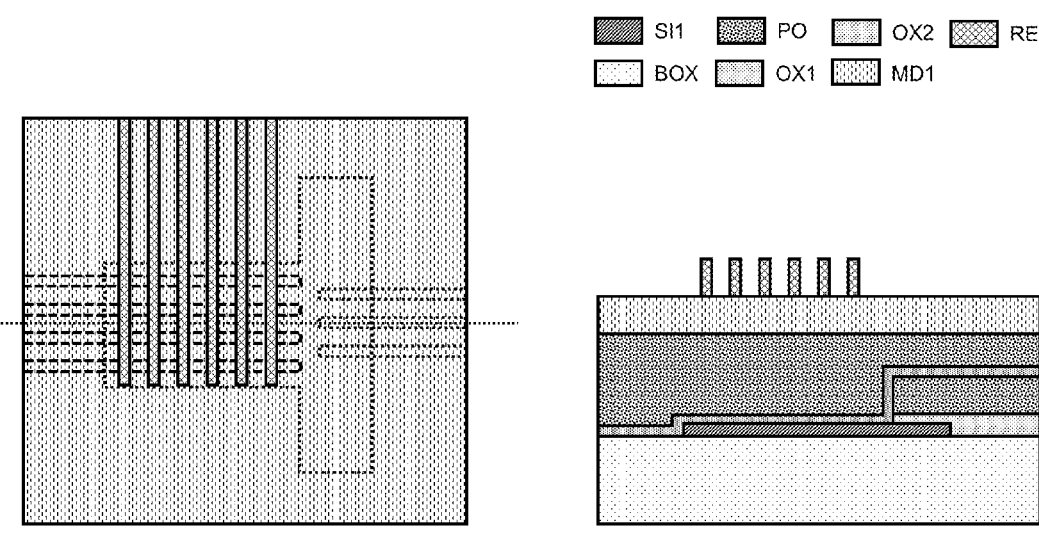
[Fig. 16T]
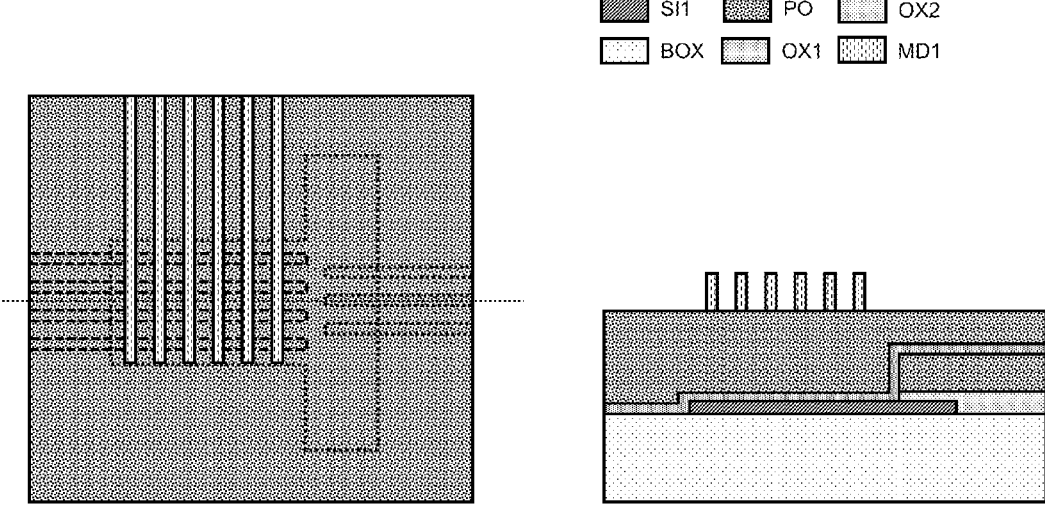

[Fig. 16U]
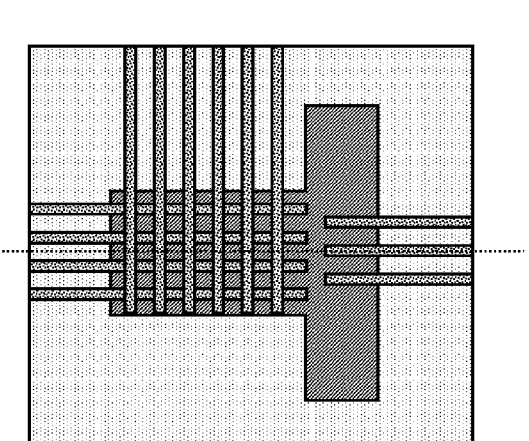
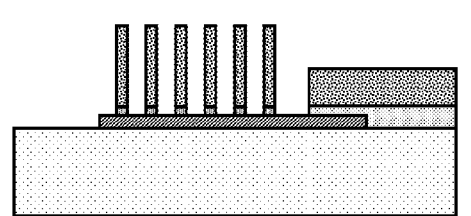
[Fig. 16V]
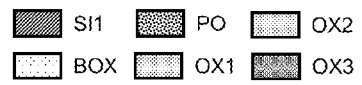
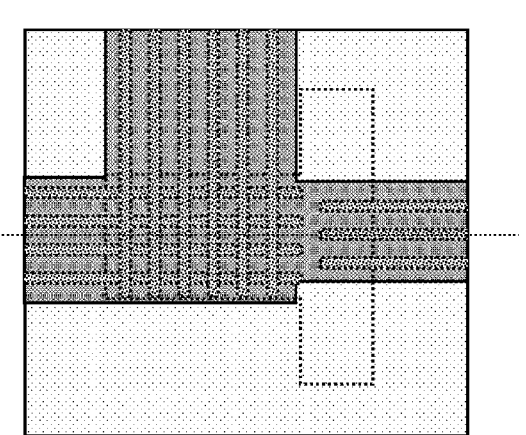
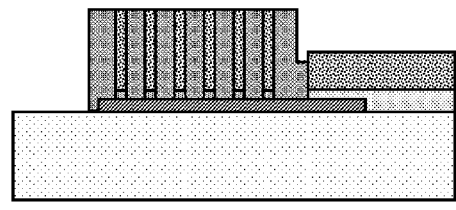

QUANTUM DEVICE, METHOD FOR READING THE STATE OF CHARGE, METHOD FOR DETERMINING A STABILITY DIAGRAM AND METHOD FOR DETERMINING SPIN CORRELATIONS

CROSS-REFERENCE TO RELATED APPLICATIONS

This application claims priority to French Patent Application No. 2109107, filed Aug. 31, 2021, the entire content of which is incorporated herein by reference in its entirety.

TECHNICAL FIELD OF THE INVENTION

The technical field of the invention is that of quantum information.

The present invention relates to a quantum device comprising a matrix of quantum dots, a method for reading the charge state of the quantum dots of such a device, a method for determining the stability diagram of such a device and a method for determining the spin correlations of a plurality of spin carrying charged particles contained in such a device.

TECHNOLOGICAL BACKGROUND OF THE INVENTION

In the field of quantum information, it is known to use matrices of quantum dots in order to realise quantum processors. More particularly, charged particles are going to be introduced into this matrix so as to be confined in the quantum dots. A plurality of spin qubits is thus going to be formed, a spin qubit representing the degree of freedom of the spin state of the charged particle or particles in one or more quantum dots.

It is also known, to measure the state of each qubit thus formed, to carry out a step of spin/charge conversion which makes it possible to convert the spin state of the charged particles into a charge state of the quantum dots containing said particles. It is then necessary to measure this charge state in order to deduce therefrom the spin state of the charged particles before conversion. To do so, a means for measuring the charge state is in general arranged facing each quantum dot. However, in a two-dimensional matrix of quantum dots, the increase in the number of quantum dots necessarily leads to the progressive distancing of the means for measuring the charge state that then resides on the periphery of the matrix. The result is a loss of measurement signal for the central quantum dots of the matrix, which makes the approach consisting in associating a measurement means with each quantum dot difficult to apply to matrices of large size.

For this type of matrix, it is possible to resort to three-dimensional structures in which the means for measuring the charge state are arranged above or below the quantum dots. An example of such a device is described in the document U.S. Pat. No. 10,607,993 B2. Yet, such an arrangement has several drawbacks. Firstly, it makes the manufacture of such matrices complex, notably in terms of alignment. Further, the presence of these measurement means makes access to the quantum dots more difficult, for example to arrange manipulation means necessary for quantum manipulations. There thus exists a need for a device making it possible to be free of the aforementioned drawbacks.

SUMMARY OF THE INVENTION

The invention offers a solution to the aforementioned problems, by making it possible to share the means for measuring the charge state at the level of one or more lines of quantum dots of the matrix of quantum dots.

A first aspect of the invention relates to a semiconductor device comprising:
- a layer of a semiconductor material in which is formed an active zone;
- a plurality of first gates forming a plurality of lines substantially parallel to each other and covering in part the active zone;
- a plurality of second gates forming a plurality of columns, the lines of the plurality of lines intersecting the columns of the plurality of columns while covering the active part and being electrically isolated from the plurality of lines, the intersection of two successive lines with two successive columns delimiting an island so as to obtain a plurality of islands spread out on a plurality of chains of islands, the chains of islands being arranged along an axis parallel to the lines of the plurality of lines, each chain of islands comprising a plurality of islands, a first end materialised by a first extreme column and a second end materialised by a second extreme column, the islands being situated in the active zone;
- at least one third gate, preferably a plurality of third gates, designated measurement gate, extending along an axis substantially parallel to the lines of the plurality of lines and in a direction opposite to the lines of the plurality of lines with respect to the active zone, the end of each measurement gate the closest to the second extreme column being situated in the active zone, the third gate or gates being configured to realise one or more measurement means arranged so as to be able to measure the charge state of the island situated at the level of the second end of each chain of islands;
- a first electrode and a second electrode situated on either side of the plurality of measurement gates in the active zone and configured such that a current going from the first electrode to the second electrode passes between the plurality of measurement gates and the second extreme column.

Two lines (or two columns) are considered as being substantially parallel when the angle that they form with respect to one another is less than or equal to 10°, preferably less than or equal to 5°, or even less than or equal to 1°. Thanks to the invention, it is no longer necessary to arrange a means for measuring the charge state for each quantum dot, the measurement means situated at the end of the lines of quantum dots being able to be used to measure the charge state of each quantum dot of each line of quantum dots. This arrangement makes it possible to simplify the manufacture of such a device and to facilitate access to the quantum dots, for example to arrange manipulation means.

Apart from the characteristics that have been mentioned in the preceding paragraph, the device according to a first aspect of the invention may have one or more complementary characteristics among the following, considered individually or according to all technically possible combinations thereof.

In one embodiment, the device comprises a plurality of fourth gates, each fourth gate of the plurality of fourth gates being situated in an island such that each island of the plurality of islands comprises a fourth gate of the plurality of fourth gates.

In one embodiment, the device comprises a plurality of fourth electrodes, each fourth electrode of the plurality of fourth electrodes being situated in the active zone, between two successive measurement gates of the plurality of measurement gates. Preferably, a fourth electrode is situated between each measurement gate.

In one embodiment, the active zone comprises a plurality of fingers, a measurement gate of the plurality of measurement gates being situated between each finger of the plurality of fingers, the fingers of the plurality of fingers being connected together by a common part, the end of the measurement gates the closest to the extreme column being situated on said common part, the first electrode being situated on a first extreme finger of the plurality of fingers, the second electrode being situated on a second extreme finger of the plurality of fingers, each finger comprised between two measurement gates comprising a fourth electrode of the plurality of fourth electrodes.

In one embodiment, each finger has an index, the indices being attributed in an increasing and continuous manner between the first extreme finger and the second extreme finger, the length of fingers having an even index being different from the length of fingers having an odd index.

In one embodiment, the layer of semiconductor material comprising the active zone comprises openings over the entirety of its thickness, said openings being situated under each intersection of a line of the plurality of lines with a column of the plurality of columns.

A second aspect of the invention relates to a quantum device comprising a matrix of quantum dots, each quantum dot being able to receive one or more charged particles so as to adopt a charge state greater than or equal to zero, the matrix of quantum dots comprising a plurality of lines of quantum dots each comprising a plurality of quantum dots, the device comprising:

a plurality of gates configured so as to enable a transfer of charged particles from a given quantum dot of the line of quantum dots to a quantum dot adjacent to the given quantum dot, the adjacent quantum dot also belonging to the considered line of quantum dots;

one or more measurement means configured to measure the charge state of each quantum dot situated at one end of the plurality of lines of quantum dots, designated extreme quantum dot.

As for the device according to a first aspect of the invention, thanks to the device according to a second aspect of the invention, it is no longer necessary to arrange a means for measuring the charge state for each quantum dot, the measurement means situated at the end of the lines of quantum dots being able to be used to measure the charge state of each quantum dot of each line of quantum dots. This arrangement makes it possible to simplify the manufacture of such a device and to facilitate access to the quantum dots, for example to arrange manipulation means.

A third aspect of the invention relates to a method for reading the charge state of the quantum dots of at least one line of quantum dots of a device according to a first aspect of the invention, the method comprising, for at least one line of quantum dots, preferably for each line of quantum dots:

a first step of determining the charge state of the extreme quantum dot of the considered line using the means for measuring the charge state associated with the considered line;

a second step of discharging the charged particles present in the extreme quantum dot;

for each quantum dot of the considered line of quantum dots and starting from the quantum dot the closest to the extreme quantum dot, a third step of transfer of the charge state of the considered quantum dot to the quantum dot adjacent to the considered quantum dot the closest to the extreme quantum dot;

these three steps being reiterated a number of times equal to the number of quantum dots of the considered line of quantum dots.

Apart from the characteristics that have been mentioned in the preceding paragraph, the method according to a third aspect of the invention may have one or more complementary characteristics among the following, considered individually or according to all technically possible combinations thereof.

In one embodiment, the steps of the method are carried out sequentially on all the lines of quantum dots of the device.

In one embodiment, the steps of the method are carried out simultaneously on all the lines of quantum dots of the device.

A fourth aspect of the invention relates to a method for determining the stability diagram of a quantum device according to a first or a second aspect of the invention, each quantum dot of the device being separated from adjacent quantum dots by a potential barrier, the method comprising:

a step of introduction of a plurality of charged particles into the quantum device;

a step of application of a set of voltages on the plurality of gates;

a step of placement of each of the quantum dots in a regime such that the potential barrier separating each quantum dot from the adjacent quantum dots is configured such that the charged particle or particles contained in the considered quantum dot cannot traverse the potential barrier to be displaced to the quantum dots adjacent to said quantum dot even when such a transition is allowed from an energy viewpoint, designated completely isolated regime;

a step of implementing a method according to a second aspect of the invention on all the lines of quantum dots of the quantum device so as to determine the charge state of each quantum dot for the set of applied voltages, the isolated regime only being lifted during the transfer of charged particles from one quantum dot to the adjacent quantum dot, the lifting of the isolated regime only concerning the quantum dots concerned by the transfer;

these steps being repeated for a plurality of sets of voltages so as to determine the stability diagram of the quantum device.

A fifth aspect of the invention relates to a method for determining the spin correlations of a plurality of spin carrying charged particles contained in the quantum dots of a device according to a first or a second aspect of the invention, the number of quantum dots of the device being an even number, the method comprising:

a step of initialisation of the charge state of the quantum dots of the device such that each quantum dot contains a single charged particle;

a step of formation of a plurality of pairs of adjacent quantum dots, a quantum dot only being able to belong to a single pair of adjacent quantum dots;

for each pair of adjacent quantum dots, a step of spin/charge conversion such that the charge state of the pair of quantum dots is dependent on the initial spin state of the charged particles contained in said pair;

a step of implementing a method according to a second aspect of the invention so as to determine the charge state of each quantum dot and thus the spin state associated with each pair of quantum dots;

these steps being repeated until the spin state of all the pairs of adjacent quantum dots that it is possible to form has been determined.

A sixth aspect of the invention relates to a method for manufacturing a semiconductor device according to a first or a second aspect of the invention from a substrate comprising a semiconductor stack, the method comprising:

A step of lithography so as to define a pattern associated with an active zone on the semiconductor stack and on the first layer of silicon oxide when such a layer has been deposited beforehand;

A step of etching of the semiconductor stack according to the pattern associated with the active zone defined during the preceding lithography step;

A step of depositing a first gate stack comprising a first dielectric layer and a second layer of a conductive material;

A step of depositing a hard mask on the gate stack;

A step of lithography so as to define a pattern associated with the pluralities of first gates and measurement gates;

A step of etching of the hard mask according to the pattern defined during the preceding lithography step so as to transfer said pattern into the hard mask;

A step of etching of the gate stack according to the pattern defined during the preceding lithography step and transferred to the hard mask;

A step of depositing a second dielectric layer on the structure obtained at the end of the preceding step;

A step of depositing a second layer of a conductive material so as to form, with the second dielectric layer, a second gate stack;

A step of depositing a hard mask on the second gate stack;

A step of lithography so as to define a pattern associated with the plurality of second gates;

A step of etching of the hard mask according to the pattern defined during the preceding lithography step so as to transfer said pattern into the hard mask;

A step of etching of the second gate stack according to the pattern defined during the preceding lithography step and transferred to the hard mask.

Apart from the characteristics that have been mentioned in the preceding paragraph, the method according to a sixth aspect of the invention may have one or more complementary characteristics among the following, considered individually or according to all technically possible combinations thereof.

In one embodiment, the substrate is an SOI (silicon on insulator) type substrate and the semiconductor stack comprises a buried oxide layer and a first layer of silicon semiconductor material. In addition, during the step of etching according to the pattern associated with the active zone defined during the preceding lithography step, the etching is stopped at the level of the buried oxide layer.

In one alternative embodiment, the semiconductor stack comprises a heterostructure of semiconductors (e.g. Si— SiGe or GaAs—AlGaAs).

In one embodiment, the method comprises, after the step of etching according to the pattern associated with the active zone, a step of realizing microstructures in the semiconductor stack at the level of the active zone.

In one embodiment, the step of realizing microstructures in the semiconductor stack comprises:

A step of depositing a hard mask on the structure obtained at the end of the preceding step, the hard mask comprising a first layer of hard mask and a second layer of hard mask arranged on the first layer of hard mask;

A step of lithography so as to define a pattern associated with a plurality of lines parallel to each other;

A step of etching according to the pattern associated with the plurality of lines defined during the preceding lithography step, the etching being carried out over the entire thickness of the second layer of hard mask so as to expose a part of the first layer of hard mask;

A step of lithography so as to define a pattern associated with a plurality of columns parallel to each other, the columns of the plurality of columns intersecting the lines of the plurality of lines, a portion of the exposed part of the first layer of hard mask remaining exposed at the end of this step;

A step of etching according to the pattern associated with the plurality of columns defined during the preceding lithography step, the etching being carried out over the entire thickness of the first layer of the hard mask so as to etch entirely the portion of the first layer of hard mask that remained exposed and thus to define a matrix of square patterns in the first layer of hard mask;

A step of selective removal of the second layer of the hard mask;

A step of etching of the semiconductor stack according to the patterns formed in the first layer of the hard mask;

A step of selective removal of the first layer of hard mask.

In one embodiment, the associated microstructure patterns are integrated during the lithography step so as to define a pattern associated with an active zone and the step of realizing microstructures is implemented during the step of etching of the active zone according to said pattern.

In one embodiment, the method comprises, before all other steps, a step of depositing a first layer of silicon oxide on the first semiconductor layer of the substrate.

In one embodiment, the method comprises, at the end of the step of depositing the second gate stack, a step of planarization of the gate stack at the level of the layer of a conductive material of said stack.

In one embodiment, the method comprises, at the end of the etching of the second gate stack, a step of conformal deposition of a layer of a dielectric material, designated spacer material, followed by a step of etching (spacer type) of said layer so as to form spacers at the level of the second gate stack.

In one embodiment, the thickness of deposited spacer material is chosen such that the active zone situated at the end of the measurement gates the closest to the second gates is covered by the dielectric material at the end of the etching of the spacer material, the method comprising, at the end of the step of etching of the layer of spacer material, a step of implantation in the zones not covered by the dielectric material.

The invention and the different applications thereof will be better understood on reading the description that follows and by examining the figures that accompany it.

BRIEF DESCRIPTION OF THE FIGURES

The figures are presented for indicative purposes and in no way limit the invention.

FIG. 1 shows a device according to a first embodiment of the invention.

FIG. 2 shows a device according to a second embodiment of the invention.

FIG. 3 shows a device according to a third embodiment of the invention.

FIG. 4 shows a device according to a fourth embodiment of the invention.

FIG. 5 shows a device according to a fifth embodiment of the invention.

FIG. 6 shows a device according to a sixth embodiment of the invention.

FIG. 7A shows a configuration in which the measurement means are formed by a plurality of measurement gates arranged on one line of quantum dots out of two.

FIG. 7B shows a configuration in which the measurement means are single electron transistors each formed by means of two measurement gates.

FIG. 8 shows a schematic representation of a quantum dot containing a charged particle.

FIG. 9 shows a schematic representation of a first mode of reading the charge state of the extreme quantum dots.

FIG. 10 shows a schematic representation of a second mode of reading the charge state of the extreme quantum dots.

FIG. 11 shows a block diagram of a method according to a second aspect of the invention.

FIG. 12 shows a schematic representation of the charge transfer from a given quantum to an adjacent quantum such as implemented in a method according to a second aspect of the invention.

FIG. 13 shows a block diagram of a method according to a third aspect of the invention.

FIG. 14 shows a schematic representation of the isolated regime implemented in the invention.

FIG. 15 shows a block diagram of a method according to a fourth aspect of the invention.

FIG. 16A to FIG. 16V schematically illustrate the different steps of manufacturing a device according to the invention.

DETAILED DESCRIPTION

Quantum Devices

As illustrated in FIG. 1, a first aspect of the invention relates to a semiconductor device DI capable of being used as a quantum device.

This device comprises a layer of a semiconductor material, for example silicon, in which is formed an active zone ZA.

This device DI comprises a plurality of first gates QG1 forming a plurality of lines substantially parallel to each other and covering in part the active zone ZA. It also comprises a plurality of second gates QG2 forming a plurality of columns substantially parallel to each other, the lines of the plurality of lines intersecting, preferably perpendicularly, the columns of the plurality of columns while covering in part the active zone ZA and being electrically isolated from the plurality of lines. The definition of a gate is here compliant with the definition in the field, namely an element comprising a layer of a conductive material (for example degenerated polysilicon) and a layer of a dielectric material (for example silicon oxide or hafnium oxide). As detailed hereafter, these gates QG1, QG2 make it possible to modulate the electrostatic field within the active zone ZA so as to be able to form with the latter a plurality of quantum dots QD.

In one embodiment, the layer of semiconductor material comprises openings over its entire thickness, said openings being situated under each intersection of a line of the plurality of lines with a column of the plurality of columns. The size of these microstructures is thus fixed by the size of the gates of the first and second pluralities of gates QG1, QG2. These microstructures make it possible to improve the confinement of potential charged particles PC present in the islands when the latter are configured to operate as quantum dots QD.

In addition, in the device DI according to the invention, the intersection of two successive lines with two successive columns delimits an island QD so as to obtain a plurality of islands spread out on a plurality of chains of islands LQD. The chains of islands LQD thus obtained are arranged along an axis parallel to the lines of the plurality of lines, each chain of islands LQD comprising a plurality of islands QD. The quantum dots QD obtained by the application of a potential on the first and second gates QG1, QG2 mentioned previously will be formed at the level of said islands. Further, each chain of islands LQD comprises a first end materialised by a first extreme column and a second end materialised by a second extreme column QG2E. It will also be noted that the islands QD also form a plurality of columns of islands CQD and in particular an extreme column of islands CQDE along the second extreme column QG2E.

Further, the device DI comprises at least one third gate, preferably a plurality of third gates, designated measurement gate EM, extending along an axis substantially parallel to the line of the plurality of lines and in a direction opposite to the lines of the plurality of lines with respect to the active zone ZA, the end of each measurement gate EM the closest to the second extreme column QG2E being situated in the active zone ZA, the third gate or gates EM being configured to realise one or more measurement means arranged so as to be able to measure the charge state of the island situated at the level of the second end of each chain of islands LQD. In other words, the measurement gate or gates EM are configured to form one or more measurement means, for example one or more qdots or instead one or more single electron transistors (SET). In addition, this or these measurement means are arranged such that the charge state of each island QD of the extreme column QG2E may be measured using one or more of these measurement means.

Finally, the device DI according to the invention comprises a first contact electrode CO1 and a second contact electrode CO2 situated on either side of the measurement gate or gates EM, in the active zone ZA and in contact with the latter. In addition, these first and second electrodes CO1,CO2 are configured such that a current going from the first electrode CO1 to the second electrode CO2 passes, in the active zone ZA, between the measurement gate or gates EM and the second extreme column QG2E.

Figure 3:
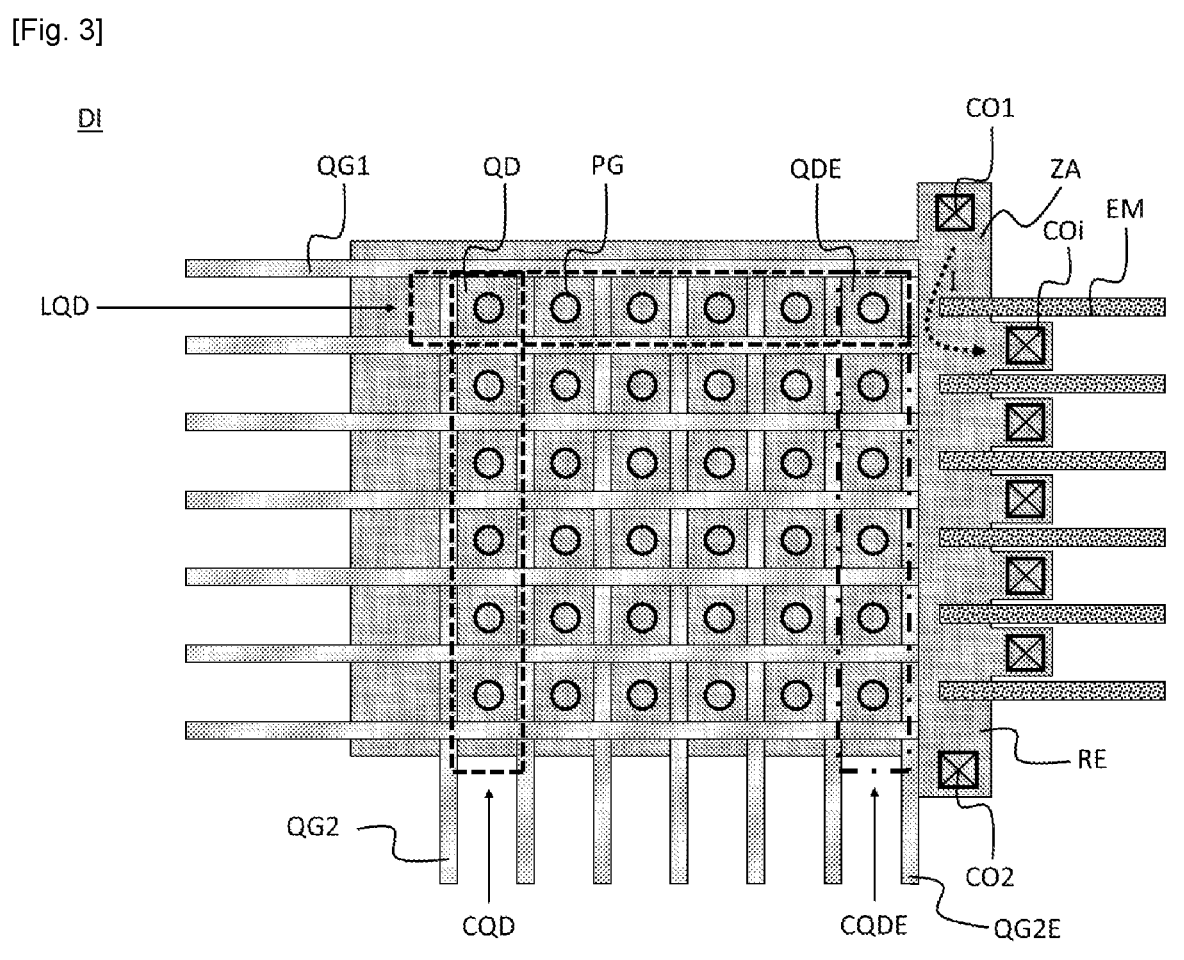

In one embodiment illustrated in FIG. 1 to FIG. 6, a third measurement electrode EM is situated facing each chain of islands QD so as to realize, for each chain of islands LQD, a means for measuring the charge state of the island situated at the level of the second end of the considered chain of islands LQD. Thus, in this embodiment, one measurement means is formed for each chain of islands LQD.

However, as mentioned previously and illustrated in FIG. 7A and FIG. 7B, it may be otherwise. For example, in the embodiment of FIG. 7A, a measurement means is formed every two chains of islands LQD by means of a measurement gate LQD. In the example of FIG. 7B, each measurement means is a single electron transistor formed by means of two measurement gates EM. In this latter example, the device comprises one measurement means for two chains of islands LQD.

In one embodiment illustrated in FIG. 2 and FIG. 3, the device DI according to the invention comprises a plurality of fourth gates PG, each fourth gate PG of the plurality of fourth gates PG being situated in an island QD such that each island QD of the plurality of islands QD comprises a fourth gate PG of the plurality of fourth gates PG.

In one embodiment illustrated in FIG. 3 and in FIG. 6, the device DI according to the invention comprises a plurality of fourth contact electrodes COi, each fourth contact electrode COi of the plurality of fourth electrodes COi being situated in the active zone ZA, in contact with the latter, between two successive measurement gates EM of the plurality of measurement gates EM. In the embodiment illustrated in FIG. 3 and in FIG. 6, a fourth contact electrode COi of the plurality of fourth electrodes COi is situated between each measurement gate EM. However, it may be otherwise. For example, when the mean(s) for measuring the charge state formed by the measurement gates EM are single electron transistors (as illustrated in FIG. 7B), then each contact electrode COi is separated from the following by two measurement gates EM.

In one embodiment, the active zone ZA comprises a plurality of fingers DTi, a measurement gate EM of the plurality of measurement gates EM being situated between each finger DTi of the plurality of fingers DTi, the fingers DTi of the plurality of fingers DTi being connected together by a common part, the end of the measurement gates EM the closest to the extreme column QG2E being situated on said common part, the first contact electrode CO1 being situated on a first extreme finger of the plurality of fingers DTi, the second contact electrode CO2 being situated on a second extreme finger of the plurality of fingers DTi, each finger DTi comprised between two measurement gates EM comprising a fourth contact electrode COi of the plurality of fourth contact electrodes COi.

In one embodiment, each finger DTi has an index, the indices being attributed in an increasing and continuous manner between the first extreme finger and the second extreme finger, the length of fingers DTi having an even index being different from the length of fingers DTi having an odd index.

In one embodiment, the length of the fingers DTi is chosen such that a part at least of each finger DTi is not separated from the following or preceding finger DTi by a measurement gate EM. In other words, the part of each measurement gate EM of the plurality of measurement gates EM outside of the common part connecting the plurality of fingers DTi has a length less than the length of the fingers DTi of the plurality of fingers DTi. This configuration notably makes it possible to facilitate contact pick up during the realization of the first contact electrode CO1, the second contact electrode CO2 and the plurality of fourth contact electrodes COi.

As detailed hereafter, the device DI according to a first aspect of the invention that has just been described may be used to realise a quantum device comprising a matrix of quantum dots QD.

A second aspect of the invention relates to a quantum device DI comprising a matrix of islands, said matrix being defined by means of a plurality of gates. In addition, the islands of the matrix are capable of being operated as quantum dots QD when an electrical potential is applied to each gate QG1,QG2 of the plurality of gates QG1,QG2, for example by means of one or more voltage sources. In the remainder of this functional description, these islands QD will be designated by the term quantum dot QD in order to underline the function that they are required to fulfil.

In one embodiment, this matrix is obtained by means of a device DI according to a first aspect of the invention, each quantum dot QD being formed at the level of each island QD by means of the gates QG1,QG2 delimiting the island in question.

The quantum device DI according to a second aspect of the invention is further configured to enable, at the level of each quantum dot QD, the charging of one or more charged particles PC so as to adopt a charge state greater than or equal to zero. In other words, the device DI is configured so as to enable a quantum dot QD to contain zero, one or several charged particles PC. For example, the charged particles PC may be electrons or instead holes.

In one embodiment, the device DI according to a second aspect of the invention is realised by means of a device DI according to a first aspect of the invention and the charging of the quantum dots QD is carried out through the reservoir or reservoirs RE of charged particles PC by playing on the electrostatic potentials defining the different quantum dots QD (and thus on the voltages applied to the plurality of gates QG1,QG2).

In addition, in the device DI according to a second aspect of the invention, the matrix of quantum dots QD comprises a plurality of lines LQD of quantum dots QD, each line LQD of quantum dots QD comprising a plurality of quantum dots QD. Similarly, it is possible to define a plurality of columns CQD of quantum dots QD, preferably perpendicular to the lines LQD of quantum dots QD.

The quantum device according to a second aspect of the invention further comprises one or more measurement means configured to measure the charge state of each quantum dot QDE situated at one end of the plurality of lines LQD of quantum dots QD, designated extreme quantum dot QDE. The extreme quantum dots QDE of the plurality of lines LQD of quantum dots QD thus form a column CQDE of extreme quantum dots QDE of which the charge state may be measured by means of the measurement mean(s) of the device according to a second aspect of the invention.

In one embodiment, the device DI according to a second aspect of the invention is realised by means of a device DI according to a first aspect of the invention and the measurement mean(s) are formed by means of the measurement gate or gates EM. It will be noted that a measurement means may comprise a single measurement gate EM or instead a plurality of measurement gates EM. Preferably, a measurement means is arranged facing each line LQD of quantum dots QD.

In one embodiment, each means for measuring the charge state comprises a third detection gate EM configured so as to form an electrometer facing the extreme quantum dot QDE. In the examples illustrated in FIG. 1 to FIG. 6, the third gate EM is parallel to the confinement gates QG1 of the plurality of first confinement gates QG1 and arranged facing the extreme quantum dot QDE. Obviously, other configurations may be envisaged in order to obtain an electrometer at the level of each extreme quantum dot QDE.

In one embodiment illustrated in FIG. 1 and FIG. 2, the detection gates EM form a plurality of detection gates EM and the device DI comprises a first contact electrode CO1 and a second contact electrode CO2 situated on either side of the plurality of third gates EM, such that a current I circulating from the first contact electrode CO1 to the second contact electrode CO2 circulates between the extreme quantum dots QDE of each line LQD of quantum dots QD and the measurement gates EM that are associated therewith. In this configuration, the measurement of the charge state of the extreme quantum dots QDE can only be done line LQD by line LQD, from the variation of the current I measured between the two measurement electrodes CO1,CO2. Indeed, if a simultaneous reading of several lines is carried out, it is then not possible to determine to which extreme quantum dot QDE the change in the current I measured between the two measurement electrodes CO1, CO2 must be attributed.

In one alternative embodiment illustrated in FIG. 3 to FIG. 6, the device DI comprises a plurality of contact electrodes COi, each measurement gate EM being associated with two electrodes COi situated on either side of the considered measurement gate EM such that a current I circulating between each of these two measurement electrodes COi circulates between the measurement gate EM and the extreme quantum dot QDE that is associated therewith. Unlike the preceding configuration, this configuration enables the simultaneous reading of the charge state of the extreme quantum dot QDE of several lines LQD of quantum dots QD. This simultaneous use may for example be implemented by applying a modulation to each gate (known as lock-in) or instead by carrying out the measurement by reflectometry by the gate (also known as gate-reflectometry), measurement in which a resonating circuit is connected to each of the gates. Obviously, other techniques may be used such as a measurement of reflectometry by the source, etc.

A first possible operating mode for the reading of the charge state is illustrated in FIG. 9. In this configuration, one measurement gate EM out of two is configured (by the application of a voltage) to prevent current from circulating between said gate EM and the extreme column QG2E. A potential is next applied to the plurality of contact electrodes COi such that a current passes between the non-blocking measurement gates EM and the extreme column QG2E. As illustrated in this figure, in one embodiment, the voltages applied on the contact electrodes COi correspond to an alternance of two voltages, each contact electrode COi being applied a voltage different from the preceding or following contact electrode COi. By reversing the role of the measurement gates EM, it is possible to measure the charge state of the entirety of extreme quantum dots QDE.

A second possible operating mode for the reading of the charge state is illustrated in FIG. 10. The configuration of voltages applied in this embodiment is identical to the preceding embodiment. In one embodiment, a modulation of voltage is applied on each measurement gate EM in order to decorrelate the component from the signal coming from the other detectors (here formed by each measurement gate EM—this measurement technique is sometimes called lock-in measurement or instead synchronous detection). This second mode has the advantage of enabling the simultaneous reading of all the extreme quantum dots QDE. On the other hand, it is necessary to take into account the influence that the detectors can have on each other.

In the quantum device DI according to a second aspect of the invention, the plurality of gates QG1,QG2 is also configured so as to enable a transfer of charged particles PC from a given quantum dot QD of the line of quantum dots QD to a quantum dot QD adjacent to the given quantum dot QD, the adjacent quantum dot QD also belonging to the considered line LQD of quantum dots QD. In other words, the transfer of charged particles PC takes place between the quantum dots QD of a same line LQD of quantum dots QD. More particularly, as illustrated in FIG. 8, this plurality of confinement gates QG1,QG2 makes it possible to create a plurality of potential barriers PE so as to define the quantum dots QD of the matrix of quantum dots QD, the latter QD making it possible to confine one or more charged particles PC in a potential well. Within this potential well (and thus a quantum dot QD), the charged particle or particles PC can adopt several energy states NE each associated with a spin state. Furthermore, the plurality of confinement gates QG1, QG2 makes it possible to modulate the potential barriers PE separating two adjacent quantum dots QD so as to isolate the latter from one another or instead to enable a transfer of charged particles PC from one to the other.

In one embodiment, the device DI according to a second aspect of the invention is realised by means of a device DI according to a first aspect of the invention and the plurality of confinement gates QG1,QG2 comprises a plurality of first confinement gates QG1 substantially parallel with each other forming a plurality of lines; and a plurality of second confinement gates QG2 substantially parallel with each other and intersecting, preferably perpendicularly, the confinement gates of the plurality of first confinement gates QG1 so as to form a plurality of columns. Furthermore, the zone defined by the intersection of two consecutive lines (or two first gates QG1 of the plurality of first gates QG1) with two consecutive columns (or two second consecutive gates QG2 of the plurality of second gates QG2) forms a quantum dot QD so as to obtain the matrix of quantum dots QD. It will be noted that the quantum dots QD thus formed comprised between the same confinement gates QG1 of the plurality of first confinement gates QG1 form a line LQD of quantum dots QD. Similarly, the quantum dots QD thus formed comprised between the same confinement gates QG2 of the plurality of second confinement gates QG2 form a column CQD of quantum dots QD.

In this embodiment, it is possible to modulate the potential barrier PE separating two quantum dots QD of a same line LQD of quantum dots QD by means of the second gate separating the two quantum dots QD. This modulation may be used to isolate the two quantum dots QD from one another or instead to transfer the charged particles PC from one to the other. In the same way, the lines can be maintained isolated from each other by means of the first gate QG1 that separates them so as to avoid any transfer of charged particles from one quantum dot QD of a line LQD of quantum dots QD to another quantum dot QD of an adjacent line LQD of quantum dots QD.

In one embodiment, the device DI comprises, for each quantum dot QD, a fourth gate PG configured so as to be able to modulate the electrostatic potential within the quantum dot QD. This fourth gate PG is known in the field as a plunger. Although optional, such a gate PG makes it possible to have available an additional degree of freedom in the configuration of the potential well at the level of each quantum dot QD.

In one embodiment, the device according to a second aspect of the invention is realised by means of a device according to a first aspect of the invention and this fourth electrode PG is situated in the zone defined by the intersection of two consecutive lines with two consecutive columns forming the considered quantum dot QD and configured to modulate the electrostatic potential within the quantum dots QD.

Reading of the Charge State

In order to read the charge state of the quantum dots QD of a device DI according to a first aspect or a second aspect of the invention, a third aspect of the invention illustrated in FIG. 11 and FIG. 12 relates to a method 100 for reading the charge state of the quantum dots QD of at least one line LQD of quantum dots QD of such a device DI. The method comprises, for at least one line LQD of quantum dots QD, preferably for all the lines LQD of quantum dots QD of the device DI, the following steps.

The method 100 firstly comprises a first step 1E1 of determining the charge state of the extreme quantum dot QDE of the considered line using the means for measuring EM the charge state associated with the considered line. At the end of this step, the charge state of the extreme quantum dot QDE is known. It will be noted that a measurement means may be associated with several extreme quantum dots QDE. Also, a measurement means is said to be associated with an extreme quantum dot QDE when the measurement means is capable of being able to determine the charge state of the considered extreme quantum dot QDE.

Once this charge state is known, it is thus possible to discharge the latter in order to re-establish a charge state equal to zero. To do so, the method comprises a second step 1E2 of discharging the charged particles PC present in the extreme quantum dot QDE. The charged particles PC potentially contained in the extreme quantum dot QDE are for example discharged into reservoirs to which the extreme quantum dot QDE may be connected. This step may for example be implemented by lowering the potential barrier PE that separates the extreme quantum dot QDE from a reservoir RE, for example by playing on the voltage applied to the second gate QG2 situated between the extreme quantum dot QDE and the reservoir RE in question. In FIG. 1 to FIG. 6, this second gate QG2 is the second gate QG2 the most to the right, that is to say the second extreme gate QG2E defining the limit of the matrix of quantum dots QD at the level of the extreme quantum dots QDE.

It is next possible to transfer the charged particles PC contained in the adjacent quantum dot in order to be able to determine the charge state thereof. To do so, the method 100 next comprises, for each quantum dot QD of the considered line LQD of quantum dots QD and starting from the quantum dot QD the closest to the extreme quantum dot QDE, a third step 1E3 of transfer of the charge state from the considered quantum dot QD to the quantum dot QD adjacent to the considered quantum dot QD the closest to the extreme quantum dot QDE. In other words, the charged particle or particles PC contained in the considered quantum dot QD are transferred to the quantum dot QD adjacent to the considered quantum dot QD the closest to the extreme quantum dot QDE. At the end of this step 1E3, the charged particle or particles PC contained in the quantum dots QD of index n have been transferred into the quantum dot QD of index n−1 (where n is the index of the considered quantum dot QD, the index 1 being attributed to the extreme quantum dot QDE and the indices then increasing). This step 1E3 may for example be implemented by lowering the potential barrier PE that separates the considered quantum dot QD from the quantum dot QD adjacent to the considered quantum dot QD the closest to the extreme quantum dot QDE, for example by playing on the voltage applied to the second gate QG2 separating the two quantum dots QD.

An illustration of the second step 1E2 and of the third step 1E3 is proposed in FIG. 12 in which each quantum dot QD is represented by a square, each transfer of charged particles PC is represented by an arrow and the reservoir RE into which is discharged the extreme quantum dot QDE is represented by a circle, the time t flowing from top to bottom.

In order to determine the charge state of each quantum dot QD of the considered line LQD of quantum dots QD, the three steps 1E1-1E3 that have just been described are reiterated a number of times equal to the number of quantum dots QD of the considered line LQD of quantum dots QD.

In one embodiment, the steps E1-E3 of the method 100 are carried out sequentially on all the lines LQD of quantum dots QD of the device DI. For example, each step E1-E3 is implemented once for each line LQD of quantum dots QD, then the cycle is repeated until the charge state of all the quantum dots QD of the device DI has been measured.

In an alternative example, each step E1-E3 is repeated for a same line LQD up to the determination of the charge state of all the quantum dots QD of the considered line LQD of quantum dots QD, then the cycle is repeated for the following line LQD of quantum dots QD until the charge state of all the quantum dots QD of the device DI has been measured. This embodiment has the advantage of being simple to implement, but the time necessary for the determination of the charge state of all the quantum dots QD of the device DI increases linearly with the number of quantum dots QD on a line LQD of quantum dots QD, but also with the number of lines LQD of quantum dots QD.

In an alternative embodiment, the steps E1-E3 of the method 100 are carried out simultaneously on all the lines LQD of quantum dots QD of the device DI. In other words, the reading of the charge state of the quantum dots QD is done in parallel on each line LQD of quantum dots QD. This embodiment is more complex to implement, but it has the advantage of being quicker, the time necessary for the determination of the charge state of all the quantum dots QD of the device DI depending on the number of quantum dots QD on a line LQD of quantum dots QD, but not the number of lines LQD of quantum dots QD.

Determination of the Stability Diagram

The notion of stability diagram is well known to those skilled in the field and a simple reminder will be made here. The stability diagram characterises the charge state of each quantum dot QD of a system, here the device DI according to a first aspect or a second aspect of the invention, as a function of the voltage applied to the gates QG1, QG2 defining the quantum dots QD of the device DI. In the device DI according to a first aspect of the invention or a second aspect of the invention, the plurality of gates QG1, QG2 makes it possible to define the quantum dots QD of the device DI and it is thus as a function of the voltage applied to this plurality of gates QG1, QG2 that the charge state of each quantum dot QD must be determined. To do so, a fourth aspect of the invention illustrated in FIG. 13 and FIG. 14 relates to a method 200 for determining the stability diagram of a quantum device DI according to a first aspect of the invention.

The method 200 comprises a step 2E1 of introduction of a plurality of charged particles PC into the quantum device DI. This introduction can be done through one or more reservoirs RE of charged particles PC to which it is possible to couple a part at least of the quantum dots QD of the device DI.

The method 200 next comprises a step 2E2 of application of a set of voltages on the plurality of gates QG1, QG2. The set of voltage characterises the voltage applied on each gate QG1, QG2 of the plurality of gates QG1, QG2 (this set of voltages thus comprises a plurality of voltages, each voltage of this plurality being applied to a gate of the plurality of gates QG1, QG2). As will be detailed hereafter, in order to establish a stability diagram, it is necessary to know the charge state of each quantum dot QD for a plurality of sets of voltages.

The method 200 also comprises a step 2E3 of placement of each of the quantum dots QD in a regime wherein the potential barrier PE separating each quantum dot QD from the adjacent quantum dots QD is configured such that the charged particle or particles PC contained in the considered quantum dot QD cannot traverse the potential barrier PE to be displaced to the quantum dots QD adjacent to said quantum dot QD even when such a transition is allowed from an energy viewpoint, designated completely isolated regime.

To illustrate the notion of completely isolated regime in the sense of the invention, a system comprising two quantum dots QD1, QD2 is illustrated in FIG. 14. In this example, each quantum dot QD1, QD2 contains a charged particle PC. In addition, the potential barrier PE separating the two quantum dots QD1, QD2 is characterised by a parameter Γ, well known to those skilled in the field as tunnelling rate. If $\tau_{proc}$ denotes the time necessary for the implementation of the steps of the method subsequent to the step of placement of each of the quantum dots QD in a completely isolated regime, then the completely isolated regime may be characterised by the fact that each quantum dot QD is separated from adjacent quantum dots QD by a potential barrier PE of which the parameter Γ verifies the relationship:

$$\Gamma \ll \frac{1}{\tau_{proc}}$$

for example:

$$\Gamma < \frac{1}{100 \times \tau_{proc}}$$

In this configuration, as illustrated in FIG. 14, a charged particle PC cannot pass from one quantum dot QD1 to the other QD2, even if an energy level is available allowing such a transfer.

The method next comprises a step 2E4 of implementing a method 100 according to a third aspect of the invention on all the lines LQD of quantum dots QD of the quantum device DI so as to determine the charge state of each quantum dot QD for the set of applied voltages. In order to enable the charge transfer from one quantum dot QD to the other necessary for the implementation of the method 100 according to a third aspect of the invention, the isolated regime only being lifted during the transfer of charged particles PC from one quantum dot QD to the adjacent quantum dot QD, the lifting of the isolated regime only concerning the quantum dots QD concerned by the transfer. In other words, only the potential barriers PE preventing the charge transfer necessary for the implementation of the method 100 according to a third aspect of the invention are concerned by the lifting of the completely isolated regime.

As already mentioned, in order to be able to establish the stability diagram, the steps 2E1-2E4 that have just been described are repeated for a plurality of sets of voltages so as to determine the stability diagram of the quantum device DI.

Determining the Spin States of the Charged Particles

When a device DI according to a first aspect of the invention or a second aspect of the invention contains spin carrying charged particles PC, the latter are going to couple with each other. In order to determine the spin state of the charged particles PC, a fifth aspect of the invention illustrated in FIG. 15 relates to a method 300 for determining the spin state (for example, between the up state and the down state) of a plurality of spin carrying charged particles PC contained in the quantum dots QD of a device DI according to a first aspect of the invention or a second aspect of the invention.

The method 300 comprises a step 3E1 of initialisation of the charge state of the quantum dots QD of the device DI such that each quantum dot QD contains a single charged particle PC. In order to know a set of voltages applied to the plurality of gates EG1, EG2 of the device DI compatible with such a distribution of the charged particles PC, it is possible to implement a method 200 for determining the stability diagram according to a fourth aspect of the invention (or any other method making it possible to determine such a stability diagram).

The method next comprises a step 3E2 of formation of a plurality of pairs of adjacent quantum dots QD, a quantum dot QD only being able to belong to a single pair of adjacent quantum dots QD. Obviously, several configurations exist making it possible to form such pairs. However, it is of little importance to know what configuration is adopted here in so far as, as will be described hereafter, the steps of the method are repeated so as to explore all the possible configurations making it possible to form such pairs.

The method next comprises, for each pair of adjacent quantum dots QD, a step 3E3 of spin/charge conversion such that the charge state of the pair of quantum dots QD is dependent on the initial spin state of the charged particles PC contained in said pair.

The method also comprises a step 3E4 of implementing a method 100 according to a second aspect of the invention so as to determine the charge state of each quantum dot QD. From the charge state of each quantum dot QD, it is possible to determine the charge state of each pair of quantum dots QD. Yet, the spin/charge conversion step makes it possible to work back to the spin state of the charged particles of said pair. Also, during this step 3E4, the spin state associated with each pair of quantum dots QD is also determined.

As already mentioned previously, these steps 3E1-3E4 are repeated until the spin state of all the pairs of adjacent quantum dots QD that it is possible of form is determined.

Manufacture of a Device According to the Invention

A sixth aspect of the invention relates to a method for manufacturing a semiconductor device DI according to the invention. This method is illustrated in FIG. 16A to FIG. 16V in which the illustration on the left is a top view and the illustration on the right is a sectional view along the dotted straight line figuring in the illustration on the left.

The manufacturing method according to the invention is implemented by means of a substrate comprising a semiconductor stack.

In one embodiment illustrated in FIG. 16A, the substrate is an SOI type substrate and the semiconductor stack comprises a first layer of a semiconductor material SI1 and a buried oxide layer BOX arranged under the first layer of semiconductor material SI1 (made of silicon).

However, the semiconductor stack (or even the substrate) may also be of bulk Si type or comprise a heterostructure of semiconductors (for example Si/SiGe, GaAs/AlGaAs, Ge/SiGe).

In other words, the semiconductor stack is chosen so as to obtain a confinement of charged particles PC along the axis perpendicular to the surface of the substrate. This confinement is realised in the silicon layer SI1 by means of the buried oxide layer BOX in the case of an SOI type substrate and by band engineering well known to those skilled in the field in the case of a semiconductor stack comprising a heterostructure (for example in the silicon layer for a Si/SiGe heterostructure). Hereafter, the invention will be illustrated in the case of a semiconductor stack relative to an SOI type substrate, but the teachings described hereafter are easily transferrable to a semiconductor stack comprising a heterostructure.

In one embodiment, the thickness of the buried oxide layer BOX is comprised between 20 nm and 200 nm, preferably equal to 145 nm. In one embodiment, the thickness of the first silicon layer is comprised between 10 nm and 20 nm, preferably equal to 16 nm.

In one embodiment, the method comprises a step of deposition (not illustrated) of a first layer of silicon oxide on the semiconductor stack, that is to say, in the example chosen, on the first layer of semiconductor material SI1 of the substrate, the third layer of silicon oxide having a thickness less than 10 nm, preferably less than 5 nm, or even less than 2.5 nm. This step is optional, but it makes it possible to avoid direct contact between the first layer of semiconductor material SI1 of the substrate and the resin RE used for the step of lithography to follow. In the remainder of the illustrations, the case will be taken where such a step has not been implemented.

As illustrated in FIG. 16B, the method next comprises a lithography step so as to define, by means of a resin RE, a pattern associated with an active zone ZA on the semiconductor stack, that is to say, in the example chosen, on the first layer of semiconductor material SI1 of the substrate and on the first layer of silicon oxide when such a layer has been deposited beforehand. This active zone ZA will come to constitute the active zone of the semiconductor device DI according to the invention. The latter ZA can thus adopt the different geometries that have been introduced during the description of the device DI according to a first aspect of the invention.

In one embodiment, the pattern comprises, at the level of the active zone ZA, structures making it possible, during the etching to follow, to realise openings within the active zone ZA. In one embodiment, these structures have a characteristic size comprised between 40 nm and 60 nm, the pitch of said structures being for its part comprised between 80 nm to 120 nm.

The method 400 next comprises a step of etching of the semiconductor stack according to the pattern associated with the active zone ZA defined during the preceding lithography step. In one embodiment, when the semiconductor stack comprises a buried oxide layer, the etching is stopped at the level of the buried oxide layer BOX of the substrate. The result obtained after removal of the resin RE is illustrated in FIG. 16C.

In an alternative embodiment, the structures at the level of the active zone ZA are realised by means of the following steps.

As illustrated in FIG. 16D, the realization of the structures comprises a step of depositing a hard mask on the structure obtained at the end of the preceding step, the hard mask comprising a first layer MD1 of hard mask (for example silicon nitride) and a second layer MD2 of hard mask (for example silicon oxide) arranged on the first layer MD1 of hard mask.

As illustrated in FIG. 16E, the realization of the structures next comprises a lithography step so as to define, by means of a resin RE, a pattern forming a plurality of lines parallel to each other.

The realization of the structures next comprises a step of etching according to the pattern associated with the plurality of lines defined during the preceding lithography step, the etching being carried out over the entire thickness of the second layer MD2 of hard mask so as to expose a part of the first layer MD1 of hard mask. The structure obtained after removal of the resin RE is illustrated in FIG. 16F.

As illustrated in FIG. 16G, the realization of the structures also comprises a lithography step so as to define, by means of a resin RE, a pattern forming a plurality of columns parallel to each other, the columns of the plurality of columns intersecting, preferably perpendicularly, the lines of the plurality of lines. As illustrated in FIG. 16G, a portion of the exposed part of the first layer MD1 of hard mask remains exposed at the end of this step. This portion takes the form of a matrix of squares, each square being situated at the intersection of a line and a column of the patterns introduced previously.

The realization of the structures next comprises a step of etching according to the pattern associated with the plurality of columns defined during the preceding lithography step, the etching being carried out over the entire thickness of the first layer MD1 of the hard mask. The structure obtained after removal of the resin RE is illustrated in FIG. 16H. It will be noted that, at the end of this step, the portion that remained exposed has been etched and appears in the form of a matrix of squares made of semiconductor material on the illustration on the left of FIG. 16H.

As illustrated in FIG. 16I, the realization of the structures next comprises a step of selective removal of the second layer MD2 of the hard mask, then, as illustrated in FIG. 16J, a step of etching of the semiconductor stack, that is to say, in the example chosen, of the first layer of semiconductor material SI1 of the substrate according to the patterns formed in the first layer MD1 of the hard mask.

As illustrated in FIG. 16K, the realization of the structures finally comprises a step of selective removal of the first layer MD1 of hard mask. At the end of this step, a matrix of openings of square shape is present on the semiconductor stack, that is to say, in the example chosen, on the first layer of semiconductor material SI1 of the substrate, these openings allowing the oxide layer BOX of the substrate to appear when the stack comprises such a layer. As already mentioned, these openings improve the electrostatic confinement within the device DI according to the invention.

As already mentioned, the realization of a structure according to one of the alternatives that have been described is optional.

The method 400 next comprises a step of depositing a first gate stack comprising a first dielectric layer OX1, for example silicon oxide and a second layer of a conductive material PO, for example a layer of degenerated polysilicon.

As illustrated in FIG. 16L, this step is followed by a step of depositing a hard mask MD on the gate stack.

As illustrated in FIG. 16M, the method next comprises a lithography step so as to define, for example by means of a resin RE, a pattern associated with the first gates QG1 and with the measurement gates EM. In one embodiment, the width of the gates is comprised between 80 nm and 120 nm, for example equal to 100 nm.

The method also comprises a step of etching of the hard mask MD1 according to the pattern defined during the preceding lithography step so as to transfer said pattern into the hard mask MD1. The structure obtained after removal of the resin RE is illustrated in FIG. 16N.

As illustrated in FIG. 16O, the method next comprises a step of etching of the gate stack according to the pattern defined during the preceding lithography step and transferred to the hard mask MD1. At the end of this step, the plurality of first gates QG1 and measurement gates EM have been formed.

As illustrated in FIG. 16P, the method next comprises a step of conformal deposition of a second dielectric layer OX2 on the structure obtained at the end of the preceding step. In one embodiment, this second dielectric layer OX2 is made of the same material as the first dielectric layer OX1 of the first gate stack, but it obviously may be otherwise. In one embodiment, the thickness deposited is comprised between 2 nm and 10 nm, preferably equal to 5 nm.

As illustrated in FIG. 16Q, the method next comprises a step of depositing a second layer of a conductive material PO, for example degenerated polysilicon so as to constitute, with the second dielectric layer deposited previously, a second gate stack. The materials used in the second gate stack may be different or, at least in part, identical to the materials used in the first gate stack.

In one embodiment, this step is followed by a step of planarization of the second gate stack at the level of the second layer of a conductive material of said stack. Although optional, this step makes it possible to facilitate the etching step to follow.

As illustrated in FIG. 16R, the method next comprises a step of depositing a hard mask MD1 on the second gate stack, then, as illustrated in FIG. 16S, a lithography step so as to define, for example by means of a resin RE, a pattern associated with the plurality of second gates QG2.

The method next comprises a step of etching of the hard mask MD1 according to the pattern defined during the preceding lithography step so as to transfer said pattern into the hard mask MD1. The structure obtained at the end of this step after removal of the resin is illustrated in FIG. 16T.

As illustrated in FIG. 16U, the method next comprises a step of etching of the gate stack according to the pattern defined during the preceding lithography step and transferred to the hard mask. At the end of this step, the plurality of second gates QG2 has been formed.

At the end of these steps, a first plurality of gates QG1, a second plurality of gates QG2 and a plurality of measurement gates EM have been obtained, the latter being arranged relative to the active zone ZA in accordance with the description that has been made of the semiconductor device according to the invention.

In one embodiment, in order to realise the spacers for the aforementioned pluralities of gates, the manufacturing method according to the invention comprises a step of conformal deposition of a layer of a dielectric material OX3, designated spacer material, followed by a step of etching (designated of spacer type). The structure obtained at the end of these two steps is illustrated in FIG. 16V.

In one embodiment, the thickness of deposited spacer material is chosen such that the part of the active zone ZA situated at the end of the measurement gates EM the closest to the second gates QG2 is covered by the dielectric material at the end of the step of etching of the dielectric material OX3. Thus, it is then possible to realize a doping of the charge reservoirs RE on the parts of active zone not covered by the dielectric material of the spacers. To do so, the method comprises, at the end of the step of etching of the layer of dielectric material OX3 of the spacers, a step of implantation in the zones not covered by the dielectric material OX3.

In an alternative embodiment, when the geometry of the spacers does not enable the implementation of a doping such as described previously, the manufacturing method according to the invention comprises, at the end of the step of etching of the second gate stack or at the end of the etching of the layer of dielectric material relative to the spacer:

a lithography step so as to define a pattern of zones to implant in order to form reservoirs of charged particles in the second layer of conductive material, on either side of the measurement gates;

a step of implantation in the zones defined during the preceding lithography step.

In one embodiment, the preceding implantation step is preceded by an epitaxy step or instead replaced by an epitaxy step with incorporation of dopants. It is useful to note that epitaxy at the level of the gates (for example, in the case of gates comprising polysilicon) is prevented by the presence of hard mask MD1 residues.

In one embodiment, the method also comprises a step of removal of the hard mask residues, advantageously by selective removal. It next comprises a step of silicidation of the top of the pluralities of the first and second gates QG1,QG2 and of the plurality of the measurement gates EM and the reservoirs RE (formed by the implanted zone) of charged particles.

Thereafter, a contact pick up according to standard procedures may be implemented in order to contact the gates QG1,QG2,EM and the reservoirs RE of charged particles PC.

The invention claimed is:

1. A semiconductor device, comprising:
a layer of a semiconductor material in which is formed an active zone;
a plurality of first gates forming a plurality of lines substantially parallel to each other and covering in a part of the active zone;
a plurality of second gates forming a plurality of columns, lines of the plurality of lines intersecting the columns of the plurality of columns while covering in the part of the active zone and being electrically isolated from the plurality of lines, an intersection of two successive lines with two successive columns delimiting an island so as to obtain a plurality of islands spread out on a plurality of chains of islands, the plurality of chains of islands being arranged along an axis parallel to the lines of the plurality of lines, each chain of islands of the plurality of chains of islands comprising a plurality of islands, a first end materialized by a first extreme column and a second end materialized by a second extreme column;
at least one third gate, designated measurement gate, extending along an axis substantially parallel to the lines of the plurality of lines and in a direction opposite to the lines of the plurality of lines with respect to the active zone, end of the designated measurement gate closest to the second extreme column being situated in the active zone, the at least one third gate or gates being configured to realize one or more measurement means arranged so as to be able to measure the charge state of the island situated at the level of the second end of each chain of islands;
a first electrode and a second electrode situated on either side of the designated measurement gate or gates in the active zone and configured such that a current going from the first electrode to the second electrode passes between the designated measurement gate or gates and the second extreme column.

2. The semiconductor device according to claim 1, wherein a third measurement electrode is situated facing each chain of islands of the plurality of chains of islands.

3. The semiconductor device according to claim 1, comprising a plurality of fourth gates, each fourth gate of the plurality of fourth gates being situated in an island such that each island of the plurality of islands comprises the fourth gate of the plurality of fourth gates.

4. The semiconductor device according to claim 2, further comprising a plurality of measurement gates and a plurality of fourth electrodes, each fourth electrode of the plurality of fourth electrodes being situated in the active zone, between two successive measurement gates of the plurality of measurement gates.

5. The semiconductor device according to claim 4, wherein the active zone comprises a plurality of fingers, a measurement gate of the plurality of measurement gates being situated between each finger of the plurality of fingers, fingers of the plurality of fingers being connected together by a common part, the end of the plurality of measurement gates closest to the first extreme column being situated on said common part, the first electrode being situated on a first extreme finger of the plurality of fingers, the second electrode being situated on a second extreme finger of the plurality of fingers, each finger of the plurality of fingers comprised between two measurement gates comprising a fourth electrode of the plurality of fourth electrodes.

6. The semiconductor device according to claim 5, wherein each finger of the plurality of fingers has an index, indices being attributed in an increasing and continuous manner between the first extreme finger and the second extreme finger, a length of the plurality of fingers having an even index being different from the length of the plurality of fingers having an odd index.

7. The semiconductor device according to claim 1, wherein the layer of the semiconductor material comprising the active zone comprises openings over an entirety of a thickness thereof, said openings being situated under each intersection of a line of the plurality of lines with a column of the plurality of columns.

8. A method for reading the charge state of the quantum dots of at least one line of the quantum dots of the semiconductor device according to claim 1, each island of the semiconductor device being configured to form a quantum dot, each chain of islands thus forming a line of the quantum dots and each island of the second extreme column forming an extreme quantum dot, the method comprising, for at least one line of the quantum dots:
  a first step of determining the charge state of the extreme quantum dot of the considered line using the one or more measurement means for measuring the charge state associated with the considered line;
  a second step of discharging the charged particles present in the extreme quantum dot;
  for each quantum dot of the considered line of the quantum dots and starting from the quantum dot the closest to the extreme quantum dot, a third step of transfer of the charge state from the considered quantum dot to the quantum dot adjacent to the considered quantum dot the closest to the extreme quantum dot;
the first, second and third steps being reiterated a number of times equal to the number of the quantum dots of the considered line of the quantum dots.

9. The method according to claim 8, wherein the first, second and third steps of the method are carried out sequentially on the lines of the quantum dots of the semiconductor device.

10. The method according to claim 9, wherein the first, second and third steps of the method are carried out simultaneously on the lines of the quantum dots of the semiconductor device.

11. A method for determining the stability diagram of a quantum device, each island of the quantum device being configured to form a quantum dot, each chain of islands thus forming a line of quantum dots and each island of the second extreme column forming an extreme quantum dot, each quantum dot being separated from adjacent quantum dots by a potential barrier, the method comprising:
  a first step of introduction of a plurality of charged particles into the quantum device;
  a second step of application of a set of voltages on the plurality of gates;
  a third step of placement of each of the quantum dots in a regime such that the potential barrier separating each quantum dot from the adjacent quantum dots is configured such that the charged particle or particles contained in the considered quantum dot cannot traverse the potential barrier to be displaced to the quantum dots adjacent to said quantum dot even when such a transition is allowed from an energy viewpoint, designated completely isolated regime;
  a fourth step of implementing a method according to claim 8 on all the lines of quantum dots of the quantum device so as to determine the charge state of each quantum dot for the set of applied voltages, the isolated regime only being lifted during the transfer of charged particles from one quantum dot to the adjacent quantum dot, the lifting of the isolated regime only concerning the quantum dots concerned by the transfer;
the first, second, third and fourth steps being repeated for a plurality of sets of voltages so as to determine the stability diagram of the quantum device.

12. A method for determining the spin state of a plurality of spin carrying charged particles contained in the quantum dots of a device, each island of the device being configured to form a quantum dot, each chain of islands thus forming a line of quantum dots and each island of the second extreme column forming an extreme quantum dot, the method comprising:
  a first step of initialization of the charge state of the quantum dots such that each quantum dot contains a single charged particle;
  a second step of formation of a plurality of pairs of adjacent quantum dots, a quantum dot only being able to belong to a single pair of adjacent quantum dots;
  for each pair of adjacent quantum dots, a third step of spin/charge conversion such that the charge state of the pair of the quantum dots is dependent on the initial spin state of the charged particles contained in said pair;
  a fourth step of implementing a method according to claim 8 so as to determine the charge state of each quantum dot and thus the spin state associated with each pair of the quantum dots;
the first, second, third and fourth steps being repeated until the spin state of all the pairs of adjacent quantum dots that it is possible of form has been determined.

13. A method for manufacturing a semiconductor device according to claim 1 from a substrate comprising a semiconductor stack, the method comprising:
  a step of lithography so as to define a pattern associated with an active zone on the semiconductor stack and on the dielectric layer present on the semiconductor stack when such a dielectric layer has been deposited beforehand;
  a step of etching of the semiconductor stack according to the pattern associated with the active zone defined during the preceding lithography step;
  a step of depositing a first gate stack comprising a second dielectric layer and a first layer of a conductive material;

a step of depositing a hard mask on the gate stack;

a step of lithography so as to define a pattern associated with the pluralities of first gates and measurement gates;

a step of etching of the hard mask according to the pattern defined during the preceding lithography step so as to transfer said pattern into the hard mask;

a step of etching of the gate stack according to the pattern defined during the preceding lithography step and transferred to the hard mask;

a step of depositing a third dielectric layer on the structure obtained at the end of the preceding etching step;

a step of depositing a second layer of a conductive material on the third dielectric layer so as to form with the latter a second gate stack;

a step of depositing a hard mask on the second gate stack;

a step of lithography so as to define a pattern associated with the plurality of second gates;

a step of etching of the hard mask according to the pattern defined during the preceding lithography step so as to transfer said pattern into the hard mask;

a step of etching of the second gate stack according to the pattern defined during the preceding lithography step and transferred to the hard mask.

14. The method according to claim 13 comprising, at the end of the step of etching according to the pattern associated with the active zone, a step of realizing microstructures in the semiconductor stack at the level of the active zone.

15. A method according to claim 14, wherein the step of realizing microstructures in the semiconductor stack comprises:

a step of depositing a hard mask on the structure obtained at the end of the preceding step, the hard mask comprising a first layer of hard mask and a second layer of hard mask arranged on the first layer of hard mask;

a step of lithography so as to define a pattern associated with a plurality of lines parallel to each other;

a step of etching according to the pattern associated with the plurality of lines defined during the preceding lithography step, the etching being carried out over the entire thickness of the second layer of hard mask so as to expose a part of the first layer of hard mask;

a step of lithography so as to define a pattern associated with a plurality of columns parallel to each other, the columns of the plurality of columns intersecting the lines of the plurality of lines, a portion of the exposed part of the first layer of hard mask remaining exposed at the end of this step;

a step of etching according to the pattern associated with the plurality of columns defined during the preceding lithography step, the etching being carried out over the entire thickness of the first layer of the hard mask so as to etch entirely the portion of the first layer of hard mask that remained exposed and thus to define a matrix of parallelogram patterns in the first layer of hard mask;

a step of selective removal of the second layer of the hard mask;

a step of etching of the semiconductor stack according to the patterns formed in the first layer of the hard mask;

a step of selective removal of the first layer of hard mask.

16. The method according to claim 15, wherein the associated microstructure patterns are integrated during the lithography step so as to define a pattern associated with an active zone and the step of realizing microstructures is implemented during the step of etching of the active zone according to said pattern.

17. The method according to claim 13, comprising, before all other steps, a step of depositing a first layer of silicon oxide on the semiconductor stack.

18. The method according to claim 13, comprising, at the end of the step of depositing the second gate stack, a step of planarization of the gate stack at the level of the layer of a conductive material of said stack.

* * * * *